United States Patent
Tanaka et al.

(10) Patent No.: US 6,660,609 B2
(45) Date of Patent: Dec. 9, 2003

(54) METHOD OF MANUFACTURING A SEMICONDUCTOR DEVICE USING LASER IRRADIATION

(75) Inventors: Koichiro Tanaka, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/214,352

(22) Filed: Aug. 8, 2002

(65) Prior Publication Data

US 2003/0031214 A1 Feb. 13, 2003

(30) Foreign Application Priority Data

Aug. 10, 2001 (JP) ........................... 2001-244845

(51) Int. Cl.$^7$ ............... H01L 21/331; H01L 21/00; H01L 21/26
(52) U.S. Cl. ............... 438/378; 438/166; 438/487; 438/795
(58) Field of Search ............... 438/166, 378, 438/487, 795

(56) References Cited

U.S. PATENT DOCUMENTS

| | | |
|---|---|---|
| 5,883,731 A | 3/1999 | Kasai |
| 6,018,413 A * | 1/2000 | Oka |
| 6,388,386 B1 * | 5/2002 | Kunii et al. |

OTHER PUBLICATIONS

Japanese Patent Laid–Open No. 06–148635, published May 27, 1994.
Japanese Patent Laid–Open No. 09–197313, published Jul. 31, 1997.
Japanese Patent Laid–Open No. 2002–23086, published Jan. 23, 2002.

* cited by examiner

*Primary Examiner*—John F. Niebling
*Assistant Examiner*—Stanetta Isaac
(74) *Attorney, Agent, or Firm*—Nixon Peabody LLP; Jeffrey L. Costellia

(57) ABSTRACT

According to a structure of the present invention disclosed in this specification, there is provided a laser irradiation apparatus, characterized by including: a plurality of lasers; a unit for controlling oscillation of the plurality of lasers; a unit for synthesizing a plurality of laser lights emitted from the plurality of lasers into a laser light; a unit for condensing the laser light on an irradiation surface or in the vicinity of the irradiation surface; and a unit for moving the laser light at least in one direction. Laser light irradiation is performed to a semiconductor film by using the above-described laser irradiation apparatus, whereby crystallization of the semiconductor film and activation of an impurity element can be performed.

48 Claims, 19 Drawing Sheets

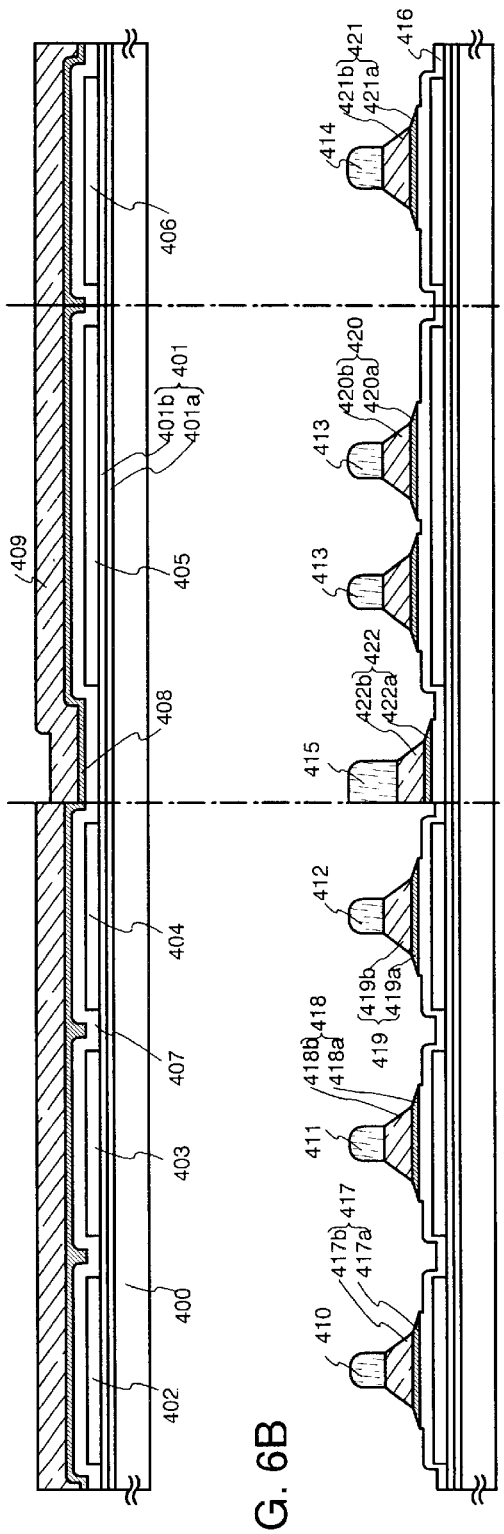
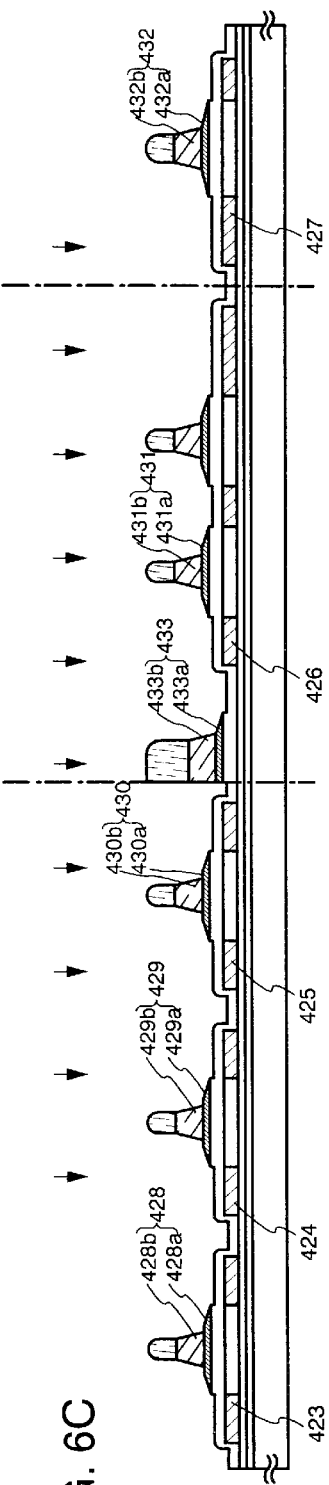
FIG. 6A
FIG. 6B
FIG. 6C

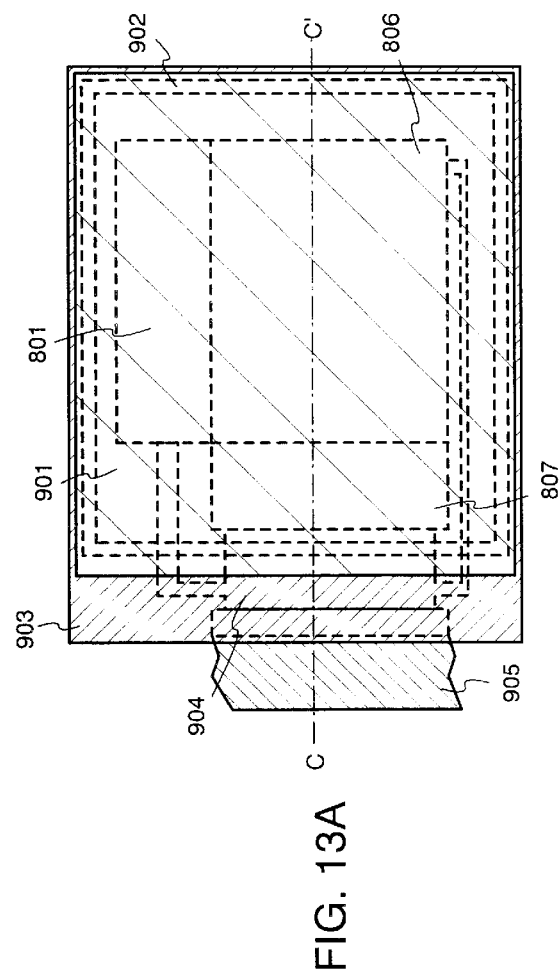
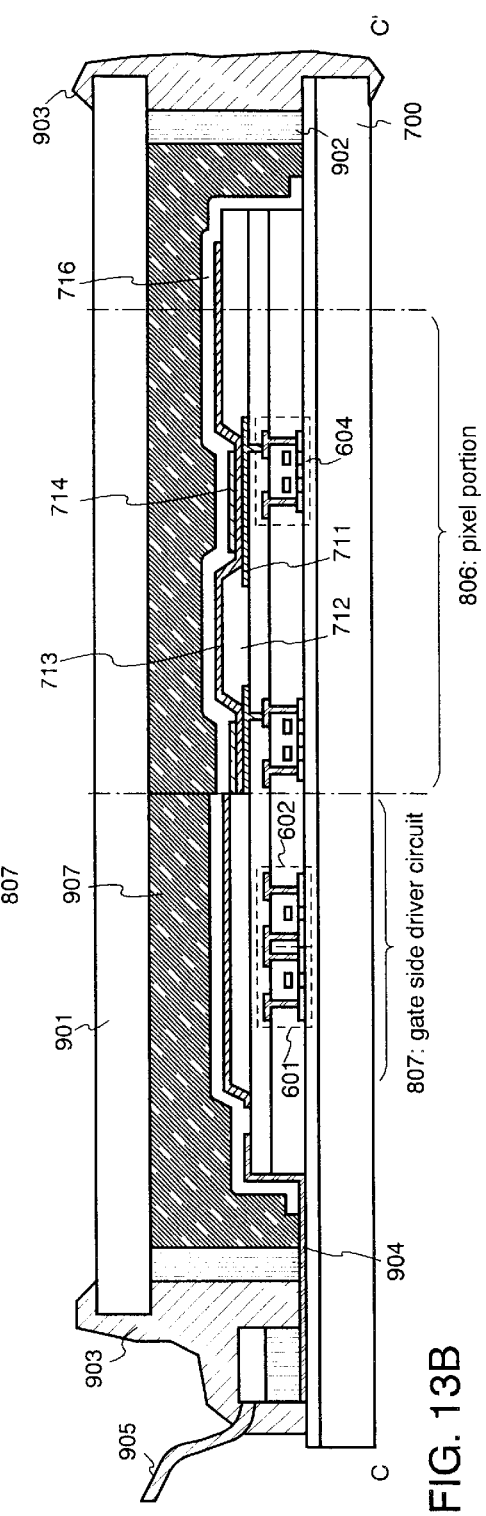
FIG. 13A
FIG. 13B

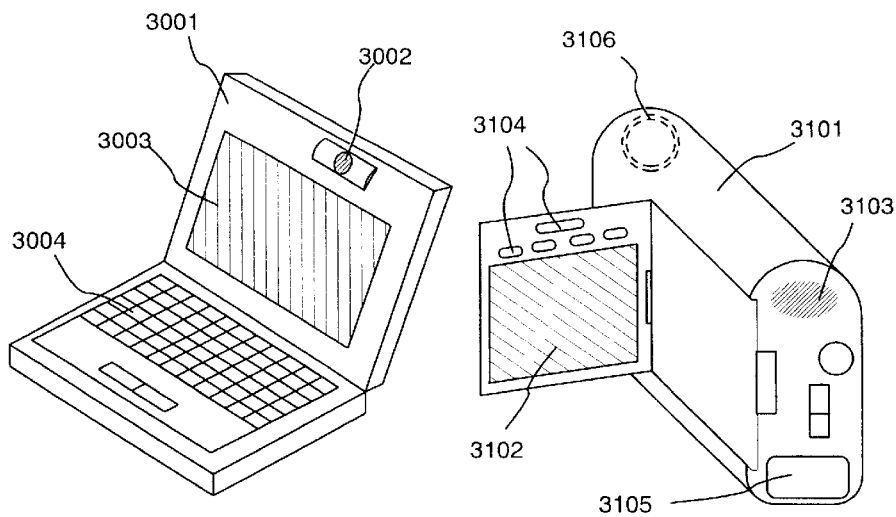
FIG. 17A
FIG. 17B
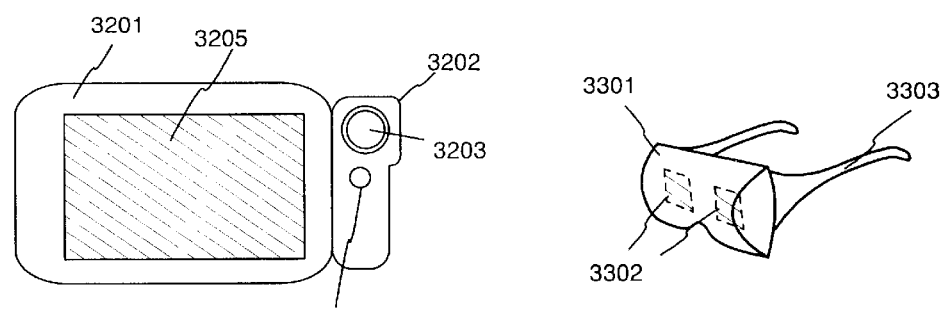
FIG. 17C
FIG. 17D
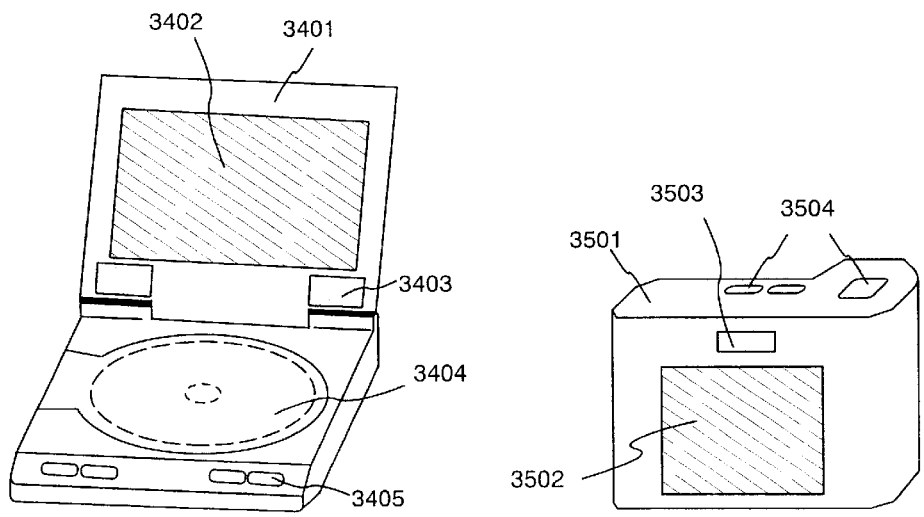
FIG. 17E
FIG. 17F

METHOD OF MANUFACTURING A SEMICONDUCTOR DEVICE USING LASER IRRADIATION

BACKGROUND OF THE INVENTION

1. Field of the Invention

The present invention relates to a method of annealing a semiconductor film using a laser light (hereinafter referred to as laser annealing) and to a laser irradiation apparatus for conducting the method (apparatus including a laser and an optical system for guiding a laser light emitted from the laser to an object to be processed). Also, the present invention relates to a method of manufacturing a semiconductor device which includes a step of irradiation of the laser light. Note that the term semiconductor device mentioned here indicates semiconductor devices in general which can function by utilizing semiconductor characteristics, and includes electro-optical devices such as a liquid crystal display device and a light emitting device and an electronic device including the electro-optical device as a component.

2. Description of the Related Art

In recent years, there has been widely studied a technique of conducting laser annealing to a semiconductor film formed on an insulating substrate made of glass or the like to crystallize the film, thereby improving crystallinity. Silicon is often used for the semiconductor film. In this specification, a method of crystallizing a semiconductor film with a laser light to obtain a crystalline semiconductor film is referred to as laser crystallization.

A glass substrate has such advantages that: it is inexpensive and has a wealth of processability; and a large-area substrate can be easily manufactured from the glass substrate in comparison with a synthetic quartz glass substrate often used in the prior art. This is the reason why the above study is being made. Further, the reason a laser is used for crystallization from choice residues in that the glass substrate has a low melting point. The laser can impart high energy only to a semiconductor film without increasing a substrate temperature much. Further, crystallization can be performed with the laser in a short time. Thus, remarkably high throughput is provided with the laser in comparison with a heating means using an electrically-heated oven.

Since a crystalline semiconductor is constituted of a large number of crystal grains, it is also called a polycrystalline semiconductor film. The crystalline semiconductor film formed by performing laser annealing has high mobility, and thus is actively used for an active matrix liquid crystal display device, for example, which is manufactured by forming thin film transistors (TFTs) using the crystalline semiconductor film and forming TFTs for a pixel portion and for a driver circuit on, for example, a glass substrate.

For example, crystallization of a semiconductor film can be performed by using a typical laser such as an excimer laser or a YAG laser. However, the YAG laser emits a coherent light having extremely high coherence. Therefore, in the case where the YAG laser is used for laser crystallization, it is difficult to form a laser light having a uniform energy distribution on an irradiation surface or in the vicinity thereof. It can be considered that the cause of the extremely high coherence of the YAG laser is that the YAG laser has a coherent length of about 10 mm or longer while the excimer laser has a coherent length of several to several tens of $\mu$m.

Further, in case of using the YAG laser, it is desirable that the laser light emitted from the laser is converted into a second harmonic using a non-linear optical element and that the converted light is formed into the laser light having a rectangular shape or elliptical shape on the irradiation surface by using an optical system. However, the non-linear optical element used for converting the laser light into the harmonic is penetrated with the laser light, and thus is required to have sufficient heat-resistance and durability. As the laser has a larger output, the deterioration of the non-linear optical element becomes larger.

SUMMARY OF THE INVENTION

The present invention has been made in view of the above, and an object of the present invention is therefore to provide a laser irradiation method in which an energy distribution of a laser light becomes uniform on an irradiation surface even with the use of an excimer laser or a YAG laser having high coherence and a laser irradiation apparatus for conducting the method. Further, another object of the present invention is to reduce deterioration of a non-linear optical element in the case where a harmonic of a laser light having energy corresponding to that of a high-output laser light is generated. Still another object of the present invention is to provide a method of manufacturing a semiconductor device including a semiconductor film obtained by performing crystallization of a semiconductor film and activation of an impurity element in accordance with the above-described laser irradiation apparatus and laser irradiation method.

According to a structure of the present invention disclosed in this specification, there is provided a laser irradiation apparatus, characterized by including: a plurality of lasers; means for controlling oscillation of the plurality of lasers; means for synthesizing a plurality of laser lights emitted from the plurality of lasers into a laser light; means for condensing the laser light on an irradiation surface or in the vicinity thereof; and means for moving the laser light at least in one direction.

The above structure of the present invention is characterized in that the laser is one or plural kinds of lasers selected from the group consisting of a solid laser, an excimer laser, an Ar laser, and a Kr laser of continuous oscillation or pulse oscillation type. As the solid laser, there may be given a YAG laser, a YVO$_4$ laser, a YLF laser, a YAlO$_3$ laser, a glass laser, a ruby laser, an alexandrite laser, a Ti:sapphire laser, and the like.

The above structure of the present invention is characterized in that at least one laser light among the plurality of laser lights is converted into a harmonic by a non-linear optical element. The laser light is converted into the harmonic before the plurality of laser lights are synthesized into a laser light, whereby deterioration of the non-linear optical element is reduced, which leads to reduction in cost.

The above structure of the present invention is characterized in that the means for synthesizing a plurality of laser lights emitted from the plurality of lasers into a laser light has a waveguide or a thin film polarizer. Thus, there is formed a laser light having an energy density corresponding to that of a laser light emitted from a large-output laser.

The above structure of the present invention is characterized in that the means for moving the laser light has a galvanometer or polygon mirror and an fθ lens. By using the above components, the laser light can be moved on the irradiation surface.

The above structure of the present invention is characterized in that when the irradiation surface is provided slant to the laser light, and when the laser light has a beam width W and a substrate has a thickness d, an incident angle φ to the irradiation surface of the laser light satisfies the equation: φ≧arcsin (W/2d). If the laser light is made incident at the incident angle φ, the reflection light caused by a surface of the substrate and the reflection light caused by a back surface of the substrate do not interfere with each other. Thus, uniform laser light irradiation can be performed. The irradiation surface is provided slant to the laser light as described above, whereby there can be prevented the occurrence of the interference in case of using the YAG laser having a long coherent length.

Further, according to a structure of the present invention disclosed in this specification, there is provided a laser irradiation method, characterized by including: synthesizing a plurality of laser lights into a laser light; condensing the laser light on an irradiation surface or in the vicinity thereof; and irradiating the laser light while moving the laser light.

The above structure of the present invention is characterized in that the laser is one or plural kinds of lasers selected from the group consisting of a solid laser, an excimer laser, an Ar laser, and a Kr laser of continuous oscillation or pulse oscillation type. As the solid laser, there may be given a YAG laser, a $YVO_4$ laser, a YLF laser, a $YAlO_3$ laser, a glass laser, a ruby laser, an alexandrite laser, a Ti:sapphire laser, and the like.

The above structure of the present invention is characterized in that at least one laser light among the plurality of laser lights is converted into a harmonic by a non-linear optical element. The laser light is converted into the harmonic before the plurality of laser lights are synthesized into a laser light, whereby deterioration of the non-linear optical element is reduced, which leads to reduction in cost.

The above structure of the present invention is characterized in that the means for synthesizing a plurality of laser lights emitted from the plurality of lasers into a laser light has a waveguide or a thin film polarizer. Thus, there is formed a laser light having an energy density corresponding to that of a laser light emitted from a large-output laser.

The above structure of the present invention is characterized in that the means for moving the laser light has a galvanometer or polygon mirror and an fθ lens. By using the above components, the laser light can be moved on the irradiation surface.

The above structure of the present invention is characterized in that when the irradiation surface is provided slant to the laser light, and when the laser light has a beam width W and a substrate has a thickness d, an incident angle φ to the irradiation surface of the laser light satisfies the equation: φ≧arcsin (W/2d). If the laser light is made incident at the incident angle φ, the reflection light caused by a surface of the substrate and the reflection light caused by a back surface of the substrate do not interfere with each other. Thus, uniform laser light irradiation can be performed.

Further, according to a structure of the present invention disclosed in this specification, there is provided a method of manufacturing a semiconductor device, characterized by including: synthesizing a plurality of laser lights into a laser light; condensing the laser light on an irradiation surface or in the vicinity thereof; and irradiating the laser light to a semiconductor film while moving the laser light, thereby performing crystallization.

Further, according to a structure of the present invention disclosed in this specification, there is provided a method of manufacturing a semiconductor device, characterized by including: introducing an impurity element to a semiconductor film; synthesizing a plurality of laser lights into a laser light; condensing the laser light on an irradiation surface or in the vicinity thereof; and irradiating the laser light to the semiconductor film while moving the laser light, thereby performing activation of the impurity element or recovery of the crystallinity of the semiconductor film.

The above structure of the present invention is characterized in that the laser is one or plural kinds of lasers selected from the group consisting of a solid laser, an excimer laser, an Ar laser, and a Kr laser of continuous oscillation or pulse oscillation type. As the solid laser, there may be given a YAG laser, a $YVO_4$ laser, a YLF laser, a $YAlO_3$ laser, a glass laser, a ruby laser, an alexandrite laser, a Ti:sapphire laser, and the like.

The above structure of the present invention is characterized in that at least one laser light among the plurality of laser lights is converted into a harmonic by a non-linear optical element. The laser light is converted into the harmonic before the plurality of laser lights are synthesized into a laser light, whereby deterioration of the non-linear optical element is reduced, which leads to reduction in cost.

The above structure of the present invention is characterized in that the means for synthesizing a plurality of laser lights emitted from the plurality of lasers into a laser light has a waveguide or a thin film polarizer. Thus, there is formed a laser light having an energy density corresponding to that of a laser light emitted from a large-output laser.

The above structure of the present invention is characterized in that the means for moving the laser light has a galvanometer or polygon mirror and an fθ lens. By using the above components, the laser light can be moved on the irradiation surface.

The above structure of the present invention is characterized in that when the irradiation surface is provided slant to the laser light, and when the laser light has a beam width W and a substrate has a thickness d, an incident angle φ to the irradiation surface of the laser light satisfies the equation: φ≧arcsin (W/2d). If the laser light is made incident at the incident angle φ, the reflection light caused by a surface of the substrate and the reflection light caused by a back surface of the substrate do not interfere with each other. Thus, uniform laser light irradiation can be performed. Thus, the crystallization of the semiconductor film, or the activation of the impurity element and the recovery of the crystallinity of the semiconductor film can be performed.

BRIEF DESCRIPTION OF THE DRAWINGS

In the accompanying drawings:

FIGS. 6A to 6C are sectional views showing a manufacturing process of a pixel TFT and driver circuit TFTs;

FIGS. 13A and 13B are a top view of a light emitting device and a sectional structural view of a driver circuit and a pixel portion of the light emitting device, respectively;

FIGS. 17A to 17F are examples of semiconductor devices;

DETAILED DESCRIPTION OF THE PREFERRED EMBODIMENTS

Figure 1:
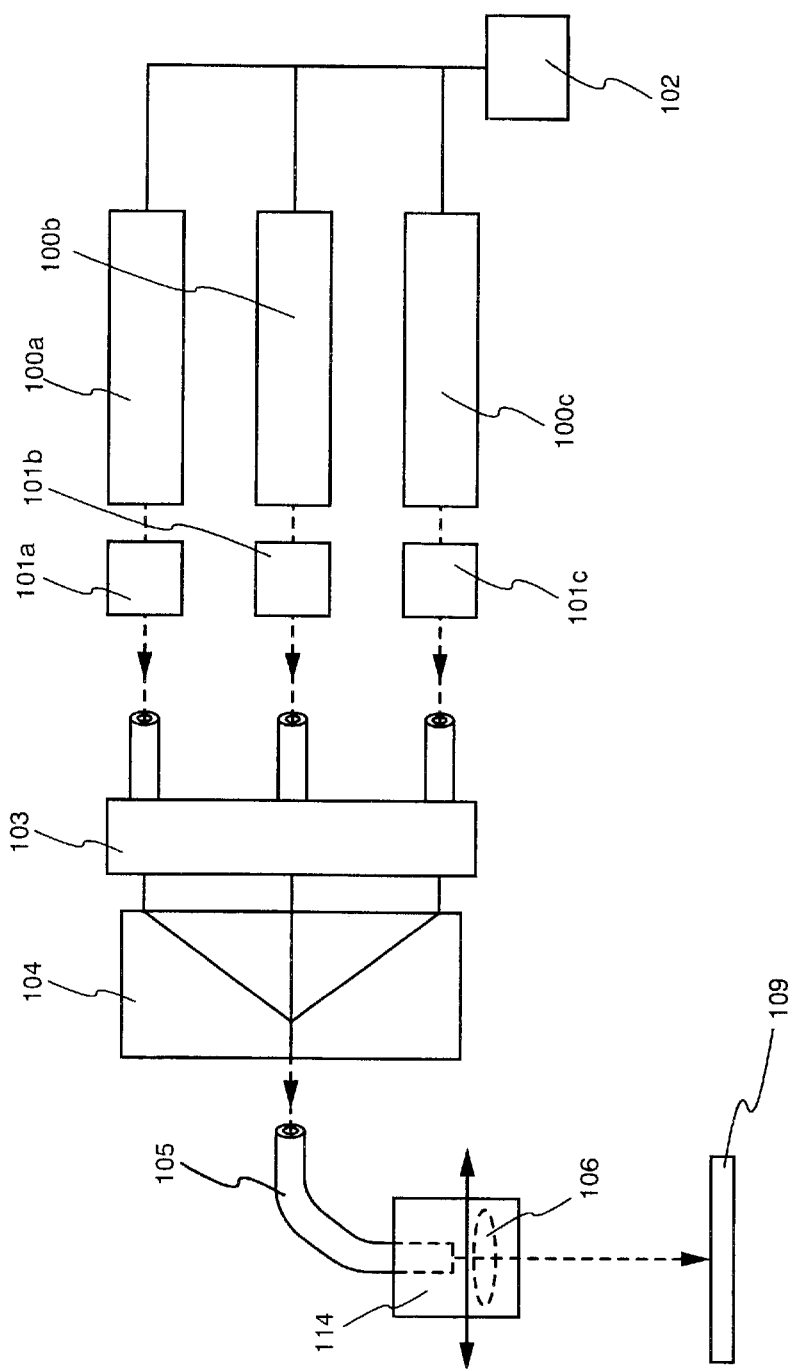
FIG. 1 is a diagram of an example of a laser irradiation apparatus disclosed in the present invention.

An embodiment mode of the present invention will be described with reference to FIG. 1.

A plurality of lasers 100 are used to synthesize a plurality of laser lights oscillated from the plurality of lasers 100a to 100c. At this time, at least one of the plurality of laser lights may be converted into a second harmonic, a third harmonic, or a fourth harmonic by non-linear optical elements 101a to 101c. Of course, the plurality of laser lights may all be converted into waves having the same wavelength. Further, a fiber array 103, a thin film polarizer (TFP) or the other polarizer may be used for a method of synthesizing the plurality of laser lights. Note that the plurality of lasers can be freely oscillated by a control device 102.

The synthesized laser light has an energy density corresponding to that of the laser light oscillated from a large-output laser. Further, the laser lights oscillated from the same laser have high coherence, but the laser lights oscillated from different lasers do not interfere with each other. Thus, the laser light obtained by synthesizing the plurality of laser lights enables reduction of interference by mutual compensation of the laser lights. Further, the non-linear optical element used for converting the laser light into the harmonic is penetrated with the laser light, and thus is required to have sufficient heat-resistance and durability. As the laser has a larger output, the deterioration of the non-linear optical element becomes larger. Therefore, the smaller the energy of the laser light to be transmitted is, the longer the life of the non-linear optical element is, which leads to reduction in cost. Accordingly, it is effective that the plurality of laser lights are modulated in wavelength by the non-linear optical element before the laser lights are synthesized into a laser light.

The laser light described above is irradiated to the entire surface of a semiconductor film by using an optical fiber, a galvanometer, a polygon mirror, and the like, whereby annealing of the semiconductor film, activation of an impurity element, and the like can be performed.

Further, the shape of the laser light on an irradiation surface differs in accordance with the kind of laser, and can be formed by an optical system. For example, the laser light emitted from an XeCl excimer laser (with a wavelength of 308 nm and a pulse width of 30 ns) L3308 made by Lambda Co., Ltd. has a rectangular shape of 10 mm×30 mm (both are half widths of a beam profile). Further, the laser light emitted from a YAG laser has a circular shape if a rod of the laser has a cylindrical shape or has a rectangular shape if the rod has a slab shape. Such a laser light is further formed by the optical system, whereby a laser light with a predetermined size can be formed.

Further, in the case where a laser light is made incident perpendicularly on a substrate, the laser light becomes a so-called return light in which a part of the laser light is reflected on the substrate surface and goes back the same optical path as in the incidence. The return light exerts harmful influences such as fluctuation of a laser output and of a frequency and breakdown of the rod. Therefore, an isolator is preferably installed in order to remove the return light and stabilize oscillation of the laser.

On the other hand, the laser light can be made incident slant on the substrate to prevent the occurrence of the return light. However, the laser light has high directivity and energy density. Thus, it is preferable that, in order to prevent a reflection light from being irradiated to an inappropriate portion, a damper is installed to absorb the reflection light. Note that a cooling water is circulated through the damper, and thus, prevents the temperature of the damper from rising due to the absorption of the reflection light.

Figure 5:
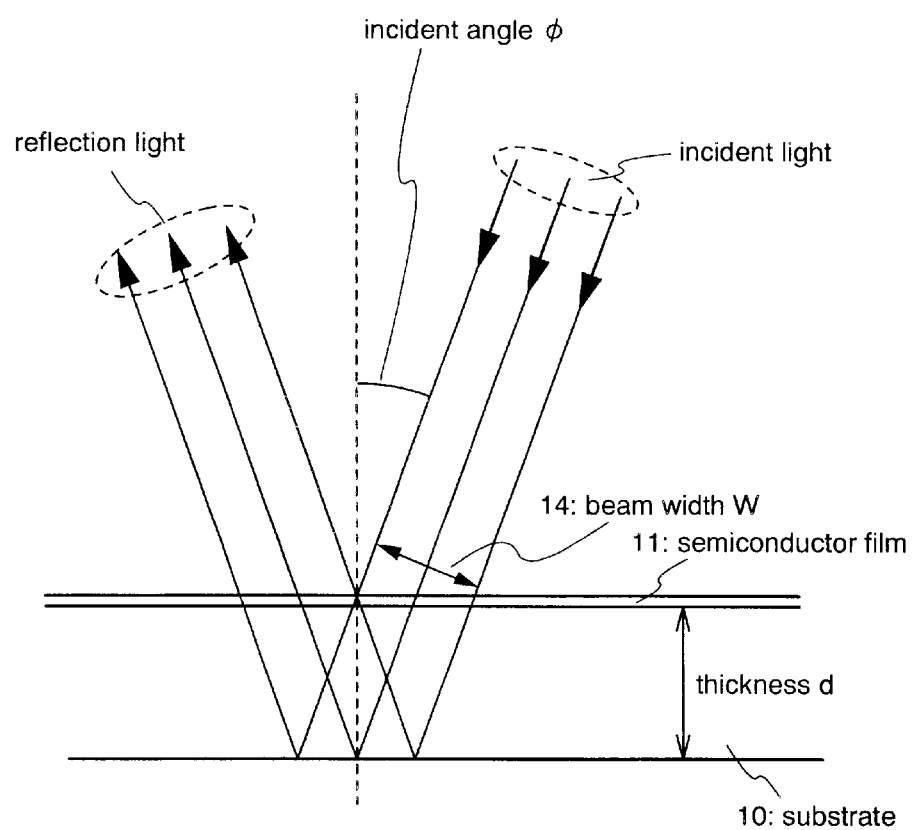
FIG. 5 is a diagram for explaining conditions of laser light irradiation performed slant to a substrate.

Here, a case where the laser light is made incident slant on the substrate is explained. As shown in FIG. 5, the laser light is made incident with a beam width W on the irradiation surface. If the incident light and the reflection light caused by the back surface of the substrate do not overlap with each other, interference due to the above lights does not occur. In other words, assuming that a thickness of the substrate is d, when a thickness of a semiconductor film is disregarded since the thickness of the semiconductor film is sufficiently smaller than the thickness of the substrate, the interference does not occur if an incident angle is larger than an incident angle φ that satisfies the following equation:

$$\sin \phi = W/2d$$

$$\therefore \phi = \arcsin (W/2d).$$

That is, when the following equation:

$$\phi \geq \arcsin (W/2d),$$

is satisfied, the interference does not occur. Therefore, it is desirable that the laser light is made incident at an angle larger than the incident angle φ.

Note that although three lasers are used in the embodiment mode, the number of lasers is not limited to three, and there is no limitation on the number as long as the number is a plural number equal to or more than two.

More detailed description will be made of the present invention in accordance with the above structure referring to embodiments shown below.

[Embodiment 1]

In this embodiment, an apparatus for irradiating a laser light to the entire surface of a substrate with the use of a plurality of lasers and a method therefor will be described with reference to FIG. 1.

The laser lights emitted from the plurality of lasers 100a to 100c are modulated into harmonics by the non-linear optical elements 101a to 101c. As the laser, there can be used a YAG laser, a $YVO_4$ laser, a YLF laser, a $YAlO_3$ laser, a glass laser, a ruby laser, an alexandrite laser, a Ti:sapphire laser, an excimer laser, an Ar laser, a Kr laser, and the like of continuous oscillation or pulse oscillation type. In this embodiment, three $YVO_4$ lasers are used, and the lights emitted therefrom are modulated into second harmonics. Here, since modulation is performed to the laser light having a relatively small output, the deterioration given to the non-linear optical elements will be small.

Then, the laser lights emitted from the respective lasers are made incident on the fiber array 103, and are synthesized into a laser light by a waveguide 104. The synthesized laser light has an energy density corresponding to that of the laser light oscillated from a large-output laser. Further, the laser lights oscillated from the same laser have high coherence, but the laser lights oscillated from different lasers do not interfere with each other. Thus, the laser light obtained by synthesizing the plurality of laser lights enables reduction of interference by mutual compensation of the laser lights.

The laser light that has passed through the waveguide 104 is again made incident on an optical fiber 105, thereby reducing diffusion of the laser light. The laser light emitted from the optical fiber 105 is condensed by a convex lens 106 fixed to the optical fiber 105 by a convex lens holder 114 to thereby reach a substrate 109. Since the optical fiber 105 has flexibility, it can be freely moved. Therefore, by moving the optical fiber 105, irradiation can be performed to the entire surface of the substrate 109.

As described above, the entire surface of the substrate is irradiated. By using the irradiation method, annealing of a semiconductor film and activation of an impurity element can be performed.

[Embodiment 2]

Figure 2:
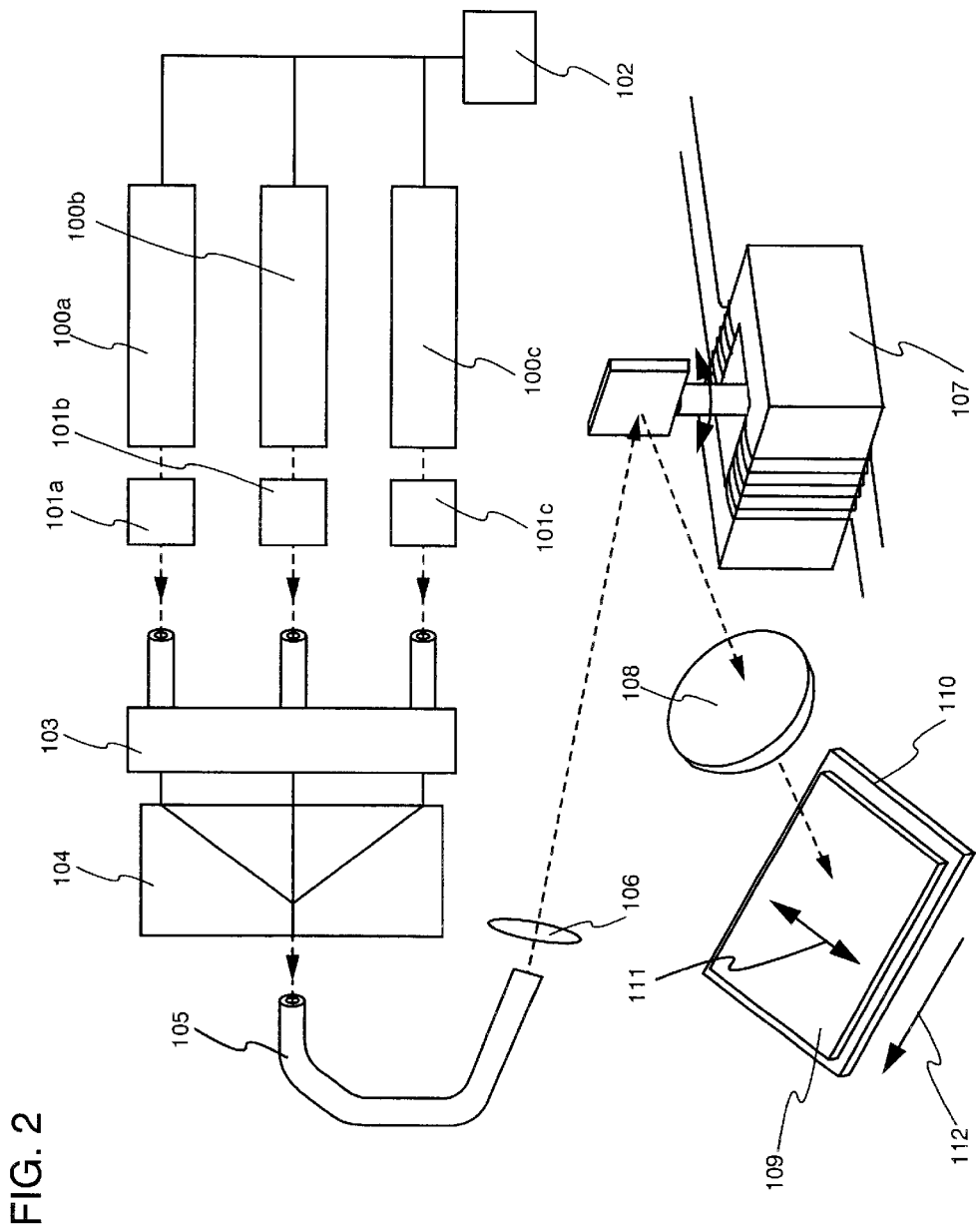
FIG. 2 is a diagram of an example of a laser irradiation apparatus disclosed in the present invention.

In this embodiment, explanation is made of an apparatus for irradiating a laser light to the entire surface of a substrate provided slant to the laser light with the use of a plurality of lasers and a galvanometer and a method therefor with reference to FIG. 2.

In accordance with Embodiment 1, the laser lights oscillated from the plurality of lasers are modulated by the non-linear optical elements 101a to 101c, and the modulated lights are synthesized into a laser light by the fiber array 103 and the waveguide 104. Further, the synthesized light is made incident on the optical fiber 105.

The laser light emitted from the optical fiber 105 is condensed by the convex lens 106. The condensed laser light reaches the substrate 109 through a galvanometer 107 and an fθ lens 108. The galvanometer 107 oscillates, whereby a mirror angle of the galvanometer changes with the lapse of time, and the position of the laser light is moved on the substrate in a direction of an arrow indicated by reference numeral 111. The galvanometer is regulated such that the laser light moves from one end to another end of the substrate width while the galvanometer oscillates for a half cycle. At this time, the fθ lens 108 is regulated such that the energy density of the laser light is always constant on the substrate even when the position of the laser light on the substrate moves. Although not shown in the figure, a cylindrical lens may be provided between the convex lens 106 and the galvanometer 107 in order to expand in one direction the shape of the laser light on the irradiation surface.

While the galvanometer oscillates for a half cycle, the laser light moves from one end to another end of the substrate width. Thus, the portion irradiated with the laser light is subjected to laser annealing. The oscillation speed of the galvanometer is regulated such that the laser light irradiation region is not intermittent. Thereafter, a stage 110 moves in a direction of an arrow indicated by reference numeral 112. Then, the movement of the laser light starts again on the substrate in the direction of the arrow 111. The above operation is repeated, whereby laser annealing can be performed to the entire surface of the substrate. That is, the movement of the irradiation position along with the rotation of the galvanometer and the movement of the stage 110 are alternately repeated, whereby the laser light is irradiated to the entire surface of the substrate.

Further, the laser light may be irradiated to the entire surface of the substrate such that while the stage 110 is moved in the direction of the arrow 112, the laser light irradiation is conducted in the direction of the arrow 111. The moving direction of the irradiation position of the laser light is slant to the side of the substrate. This is because the moving directions of the stage and the laser light are synthesized. In order to irradiate the laser light to the substrate with efficiency, it is preferable to perform irradiation by an irradiation method in which the irradiation position of the laser light, which is moved by the galvanometer, reciprocates. However, when the moving direction of the laser light is made constant for the convenience of a process, after the galvanometer oscillates for a half cycle, the laser light is stopped. This operation may be repeated.

Further, in this embodiment, the substrate is provided slant to the laser light. By providing the substrate slantly, without influences of the return light, there are eliminated fears that laser output and frequency fluctuate and that a rod is broken. Further, by using the laser light with a wavelength which penetrates the semiconductor film or the substrate, it is possible to reduce the influence of the interference of the laser light that is incident on the substrate and the reflection light caused by the back surface of the substrate. Thus, more uniform laser annealing can be performed.

However, the laser light has high directivity and energy density, and thus it is preferable that the reflection light is absorbed by providing a damper (not shown) in order to prevent the reflection light from being irradiated to an inappropriate portion. Note that a cooling water is circulated through the damper, and prevents the temperature of the damper from rising due to the absorption of the reflection light.

[Embodiment 3]

Figure 3:
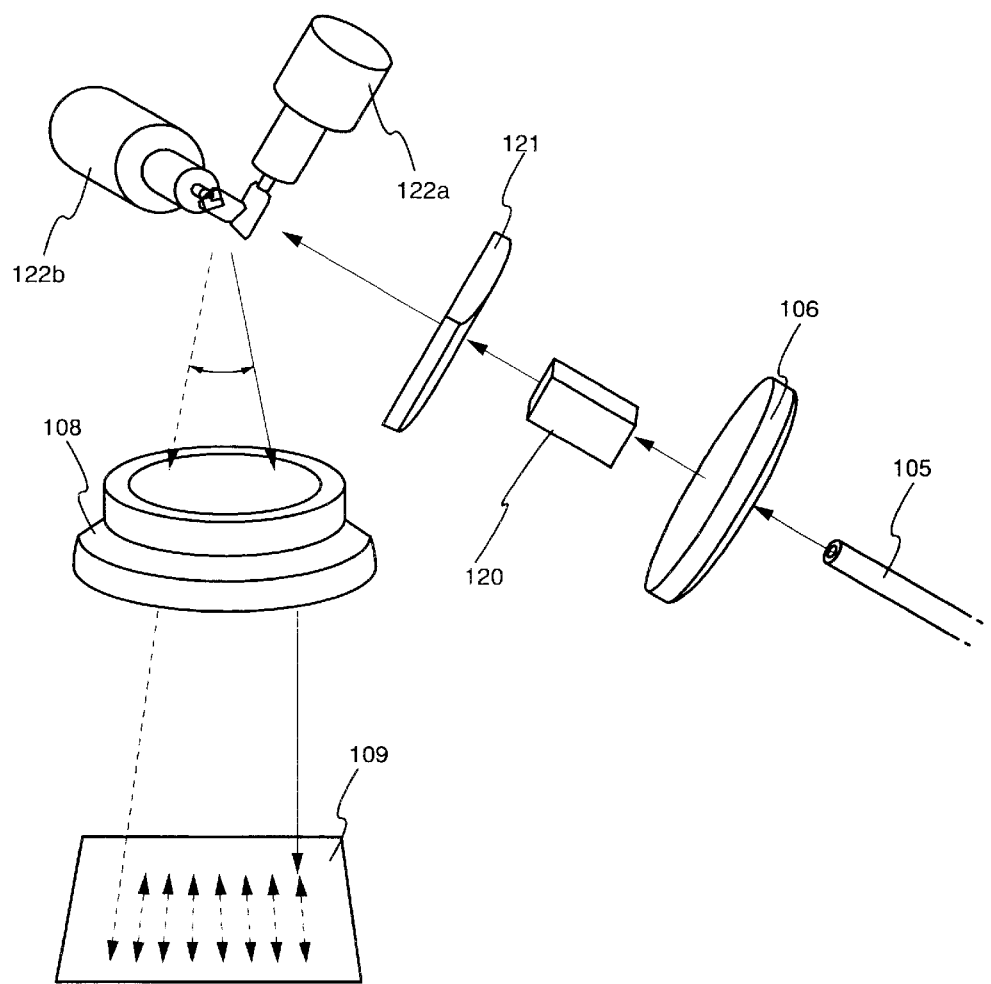
FIG. 3 is a diagram of an example of a laser irradiation apparatus disclosed in the present invention.

In this embodiment, explanation is made of an apparatus for irradiating a laser light to the entire surface of a substrate provided slant to the laser light with the use of a plurality of lasers and two galvanometers and a method therefore with reference to FIG. 3.

In accordance with Embodiment 1, the laser lights oscillated from the plurality of lasers are modulated by the non-linear optical elements 101, and the modulated lights are synthesized into a laser light by the fiber array 103 and the waveguide 104. Further, the synthesized light is made incident on the optical fiber 105.

The laser light emitted from the optical fiber 105 is condensed by the convex lens 106. The condensed laser light reaches the substrate 109 through galvanometers 122a and 122b and the fθ lens 108. The galvanometers 122a and 122b oscillate, whereby a mirror angle of the galvanometer 122a changes with the lapse of time, and the position of the laser light is moved on the substrate. The galvanometer 122a is regulated such that the laser light moves from one end to another end of the substrate width while the galvanometer 122a oscillates for a half cycle. At this time, the fθ lens 108 is regulated such that the energy density of the laser light is always constant on the substrate even when the position of the laser light on the substrate moves. Further, a cylindrical lens 121 may be provided between the fiber 105 and the galvanometer 122a, and preferably, between the convex lens 106 and the galvanometer 122a, in order to expand in one direction the shape of the laser light on the irradiation surface. Further, an isolator 120 may be arranged in order to prevent a so-called return light in which a part of the laser light is reflected and goes back the same optical path as in the incidence.

While the galvanometer 122a oscillates for a half cycle, the laser light moves from one end to another end of the substrate width. Thus, the portion irradiated with the laser light is subjected to laser annealing. The oscillation speed of the galvanometer 122a is regulated such that the laser light irradiation region is not intermittent. Thereafter, the angle of the galvanometer 122b is changed, and the galvanometer 122a oscillates again, whereby the movement of the laser light starts on the substrate. The above operation is repeated, whereby laser annealing can be performed to the entire surface of the substrate. That is, the movement of the irradiation position along with the rotations of the galvanometers 122a and 122b is repeated, whereby the laser light is irradiated to the entire surface of the substrate.

Further, the laser light may be irradiated to the entire surface of the substrate such that while the galvanometer 122b is gradually rotated, the galvanometer 122a is rotated. The moving direction of the irradiation position of the laser light is slant to the side of the substrate. This is because the two moving directions are synthesized. In order to irradiate the laser light to the substrate with efficiency, it is preferable to perform irradiation by an irradiation method in which the irradiation position of the laser light, which is moved by the galvanometer 122a, reciprocates. However, when the moving direction of the laser light is made constant for the convenience of a process, the following operation may be repeated. That is, after the galvanometer 122a oscillates for a half cycle, the laser light is stopped.

[Embodiment 4]

Figure 4:
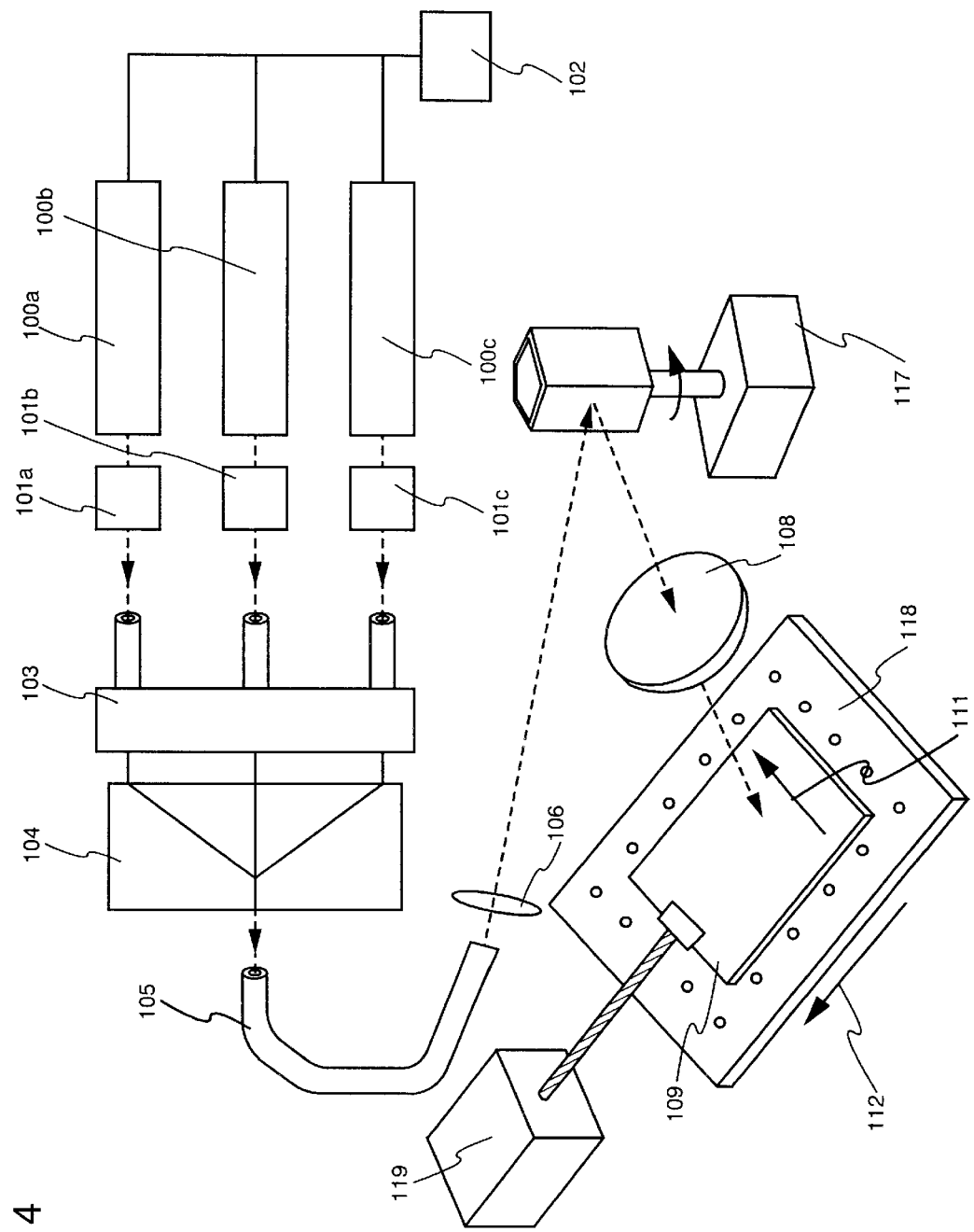
FIG. 4 is a diagram of an example of a laser irradiation apparatus disclosed in the present invention.

In this embodiment, explanation is made of an apparatus for irradiating a laser light to the entire surface of a substrate with the use of a polygon mirror and a method therefor with reference to FIG. 4.

In accordance with Embodiment 1, the laser lights oscillated from the plurality of lasers are modulated by the non-linear optical elements 101, and the modulated lights are synthesized into a laser light by the fiber array 103 and the waveguide 104. Further, the synthesized light is made incident on the optical fiber 105.

The laser light emitted from the optical fiber 105 is condensed by the convex lens 106 to reach the substrate 109 through a polygon mirror 117 and the fθ lens 108. The polygon mirror 117 is constituted of a plurality of mirrors. The angle of the mirrors changes with the lapse of time by the rotation of the polygon mirror 117, whereby the position of the laser light on the substrate moves in the direction of the arrow indicated by reference numeral 111. While the polygon mirror 117 rotates, the laser light oscillates at a predetermined position, and the polygon mirror 117 is regulated such that the laser light moves from one end to another end of the substrate width. At this time, the fθ lens 108 is adjusted such that the energy density of the laser light is always constant on the substrate even when the position of the laser light on the substrate moves. Further, although not shown in the figure, a cylindrical lens may be provided between the fθ lens 108 and the substrate 109 in order to expand in one direction the shape of the laser light on the irradiation surface.

The polygon mirror 117 starts rotation, and while the laser light is irradiated to one of the mirrors constituting the polygon mirror 117, the laser light moves from one end to another end of the substrate width. Thus, the portion irradiated with the laser light is subjected to laser annealing. The rotational speed of the polygon mirror is adjusted such that laser annealing with laser light is appropriately performed. Thereafter, the substrate moves in the direction of the arrow indicated by reference numeral 112, and then, the movement of the laser light begins again on the substrate in the direction of the arrow 111. The distance of the movement depends on the size of the laser light, and is adjusted such that laser annealing is performed uniformly to the entire substrate. The above operation is repeatedly conducted, whereby laser annealing can be performed to the entire surface of the substrate.

Further, while the substrate is moved in the direction of the arrow 112, the laser light irradiation is performed in the direction of the arrow 111. As a result, the laser light is irradiated to the entire surface of the substrate by the movement of the irradiation position along with the rotation of the polygon mirror and the movement of the substrate.

Here, a substrate moving mechanism is explained. Nitrogen, for example, is supplied from a gas supply pipe (not shown) to a stage 118 for jetting inert gas to be jetted. The substrate 109 is floated by the pressure of the jetted gas. The movement of the substrate can be conducted by adjusting a flow rate of the inert gas to be jetted. Further, it is possible that the position of the substrate is stabilized and the substrate is moved to a desired position by means of a substrate holding mechanism 119. Note that the substrate moving mechanism can be employed in combination with any of Embodiments 1 to 3.

[Embodiment 5]

In this embodiment, a method of manufacturing an active matrix substrate which includes a thin film transistor formed by above mentioned laser crystallization will be described with reference to FIGS. 6A to 9. A substrate on which a CMOS circuit, a driver circuit, and a pixel portion having a pixel TFT and a storage capacitor are formed together is called active matrix substrate for convenience.

First, a substrate 400 formed of glass such as barium borosilicate glass and aluminum borosilicate glass, which is typically represented by Corning #7059 glass and #1737 glass, is used in this embodiment. The substrate 400 may be a quartz substrate, a silicon substrate, a metal substrate or stainless substrate, which has an insulating film on the surface. The substrate 400 may be a plastic substrate having heat resistance, which can withstands a process temperature in this embodiment.

Next, a base film 401 having an insulating film such as silicon oxide film, silicon nitride film, and a silicon oxynitride film is formed on the substrate 400. In this embodiment, a two-layer structure is used for the base film 401. However, a structure may be used where a single layer film, which is the insulating film itself, or at least two layers are stacked. As a first layer of the base film 401, a silicon oxynitride film 401a is formed 10 to 200 nm (preferably 50 to 100 nm) thick by using $SiH_4$, $NH_3$ and $N_2O$ as a reaction gas in accordance with the plasma CVD method. In this embodiment, a silicon oxynitride film 401a (compositional ratio: Si=32%, O=27%, N=24% and H=17%) was formed with a thickness of 50 nm. Next, as a second layer of the base film 401, a silicon oxynitride film 401b is formed 50 to 200 nm (preferably 100 to 150 nm) thick by using $SiH_4$ and $N_2O$ as a reaction gas in accordance with the plasma CVD method. In this embodiment, a silicon oxynitride film 401b (compositional ratio: Si=32%, O=59%, N=7% and H=2%) is formed with a thickness of 100 nm.

Next, a semiconductor film is formed on the base film. First, the semiconductor film is formed with a thickness of 25 to 80 nm (preferably 30 to 60 nm) by a well known method (such as the sputtering method, LPCVD method and plasma CVD method). In this embodiment, an amorphous silicon film with a thickness of 55 nm is formed by plasma CVD method. Note that, the semiconductor film may be an amorphous semiconductor film, a micro crystal semiconductor film or a crystalline semiconductor film. Alternatively, the semiconductor film may be a compound semiconductor film having an amorphous structure such as an amorphous silicon germanium film.

Further, the semiconductor film is crystallized by a laser crystallization method of the present invention. Of course, the laser crystallization can be carried out by combining other known method (such as thermal crystallization method using RTA or a furnace annealing and thermal crystallization method using a metal element facilitating the crystallization). Patterning is performed on the obtained crystalline semiconductor film in a desired form in order to form the semiconductor layers 402 to 406.

When a crystalline semiconductor film is produced in accordance with the laser crystallization method, a plurality of laser selected form the pulse oscillation type or the continuous light-emitting type of excimer laser, YAG laser, $YVO_4$ laser, YLF laser, $YAlO_3$ laser, glass laser, ruby laser, Ti: sapphire laser or the like may be applied. And, a method that laser lights emitted from a laser oscillator are gathered by an optical system as shown in FIGS. 1 to 4 and irradiates the semiconductor film is employed.

In this embodiment, a second harmonic of a continuous oscillation type $YVO_4$ laser of 10 W is gathered by an optical system as shown in FIG. 1, and irradiates the semiconductor film at a scanning speed of 0.5 to 2000 cm/s. Thus, a crystalline silicon film is formed. Incidentally, the laser crystallization may be carried out under a condition with the laser energy density at a surface of laser irradiation of 0.01 to 100 $MW/cm^2$, preferably of 0.1 to 10 $MW/cm^2$.

Then, the semiconductor layers 402 to 406 are formed by pattering treatment using photolithography method. After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using an insulating film 40 to 150 nm thick containing silicon in accordance with plasma CVD method or sputtering method. In this embodiment, a silicon oxynitride film (compositional ratio: Si=32%, O=59%, N=7% and H=2%) with a thickness of 110 nm is formed in accordance with the plasma CVD method. Notably, the gate insulating film is not limited to the silicon oxynitride film but other insulating films containing silicon may be used as a single layer or as a laminated layers.

When a silicon oxide film is used as the gate insulating film, it is formed by mixing Tetraethyl Orthosilicate (TEOS) and $O_2$ by plasma CVD method, which is discharged under a condition with reaction pressure of 40 Pa, a substrate temperature of 300 to 400° C. and high frequency (13.56 MHz) power density of 0.5 to 0.8 $W/cm^3$. Thermal annealing at 400 to 500° C. thereafter can give good characteristics to the silicon oxide film produced in this way as a gate insulating film.

Next, a first conductive film 408, which is 20 to 100 nm thick, and a second conductive film 409, which is 100 to 400 nm thick, is stacked on the gate insulating film 407. In this embodiment, the first conductive film 408 formed by a TaN film with a thickness of 30 nm and the second conductive film 409 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride ($WF_6$). In both cases, the use of the gate electrode needs low resistance. Therefore, the resistivity of the W film is desirably 20 $\mu\Omega$cm or below. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 $\mu\Omega$cm can be achieved.

While, in this embodiment, the first conductive film 408 is TaN and the second conductive film 409 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Next, masks 410 to 415 made of resist are formed by photolithography method, and first etching process is performed thereon in order to form electrodes and wirings. The first etching process is performed under first and second etching conditions (FIG. 6B). The first etching condition in this embodiment is to use Inductively Coupled Plasma (ICP) etching and to use $CF_4$ and $Cl_2$ and $O_2$ as an etching gas, whose amount of gases are 25/25/10 (seem), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 410 to 415 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for about 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased about 10 to 20% more.

In the first etching process, when the form of the resist mask is appropriate, the shape of the ends of the first and the second conductive layers are in the tapered shape due to the effect of the bias voltage applied to the substrate side. The angle of the tapered portion is 15 to 45°. Thus, conductive layers 417 to 422 in a first shape are formed which include the first conductive layers and the second conductive layers (first conductive layers 417a to 422a and second conductive layer 417b to 422b) through the first etching process. Reference numeral 416 is a gate insulating film, and in the gate insulating film 416, an area not covered by the first conductive layers 417 to 422 in first shape is etched by about 20 to 50 nm to form a thinner area.

Next, second etching process is performed without removing masks made of resist (FIG. 6C). Here, $CF_4$, $Cl_2$ and $O_2$ are used to etch the W film selectively. Then, second conductive layers 428b to 433b are formed by the second etching process. On the other hand, the first conductive layers 417a to 422a are hardly etched, and conductive layers 428 to 433 in the second shape are formed.

First doping process is performed without removing masks made of resist and low concentration of impurity element, which gives n-type to the semiconductor layer, is added. The doping process may be performed in accordance with the ion-doping method or the ion-implanting method. The ion doping method is performed under a condition in the dose of $1 \times 10^{13}$ to $5 \times 10^{14}/cm^2$ and the accelerating voltage of 40 to 80 keV. In this embodiment, the ion doping method is performed under a condition in the dose of $1.5 \times 10^{13}/cm^2$ and the accelerating voltage of 60 keV. The n-type doping impurity element may be Group 15 elements, typically phosphorus (P) or arsenic (As). Here, phosphorus (P) is used. In this case, the conductive layers 428 to 433 function as masks for the n-type doping impurity element. Therefore, impurity regions 423 to 427 are formed in the self-alignment manner. An n-type doping impurity element in the concentration range of $1 \times 10^{18}$ to $1 \times 10^{20}/cm^3$ are added to the impurity regions 423 to 427.

When masks made of resist are removed, new masks 434a to 434c made of resist are formed. Then, second doping process is performed by using higher accelerating voltage than that used in the first doping process. The ion doping method is performed under a condition in the dose of $1 \times 10^{13}$ to $1 \times 10^{15}/cm^2$ and the accelerating voltage of 60 to 120 keV. In the doping process, the second conductive layers 428b to 432b are used as masks against the impurity element. Doping is performed such that the impurity element can be added to the semiconductor layer at the bottom of the tapered portion of the first conductive layer. Then, third doping process is performed by having lower accelerating voltage than that in the second doping process to obtain a condition shown in FIG. 7A. The ion doping method is performed under a condition in the dose of $1 \times 10^{15}$ to $1 \times 10^{17}/cm^2$ and the accelerating voltage of 50 to 100 keV. Through the second doping process and the third doping process, an n-type doping impurity element in the concentration range of $1 \times 10^{18}$ to $5 \times 10^{19}/cm^3$ is added to the low concentration impurity region 436, 442 and 448, which overlap with the first conductive layer. An n-type doping impurity element in the concentration range of $1 \times 10^{19}$ to $5 \times 10^{21}/cm^3$ is added to the high concentration impurity regions 435, 441, 444 and 447.

With proper accelerating voltage, the low concentration impurity region and the high concentration impurity region can be formed by one doping process, not by separately performing the second doping process and the third doping process.

Figure 7A:
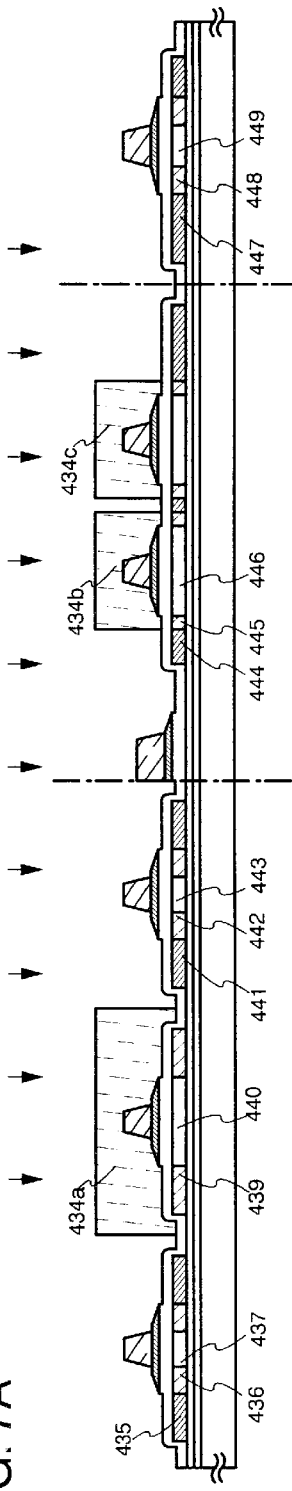
FIGS. 7A to 7C are sectional views showing the manufacturing process of a pixel TFT and driver circuit TFTs.
Figure 7B:
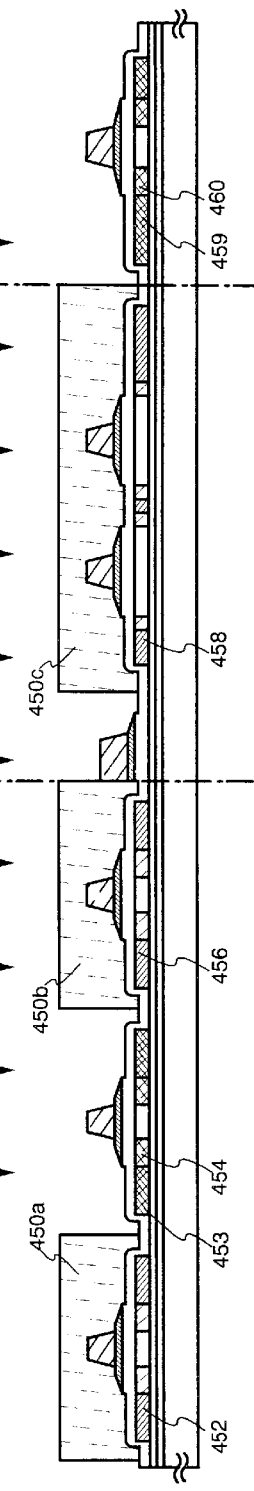

Next, after removing masks made of resist, new masks 450a to 450c made of resist are formed to perform the fourth doping process. Through the fourth doping process, impurity regions 453, 454, 459 and 460, to which an impurity element doping a conductive type opposite to the one conductive type is added, in a semiconductor layer, which is an active layer of a p-channel type TFT. Second conductive layers 428a to 432a are used as mask against the impurity element, and the impurity element giving p-type is added so as to form impurity regions in the self-alignment manner. In this embodiment, the impurity regions 453, 454, 459 and 460 are formed by applying ion-doping method using diborane ($B_2H_6$) (FIG. 7B). During the fourth doping process, the semiconductor layer forming the n-channel type TFT is covered by masks 450a to 450c made of resist. Thorough the first to the third doping process, phosphorus of different densities is added to each of the impurity regions 453 and 454. Doping process is performed such that the concentration of p-type doping impurity element can be $1 \times 10^{19}$ to $5 \times 10^{21}$ atoms/$cm^3$ in both regions. Thus, no problems are caused when they function as the source region and the drain region of the p-channel type TFT.

Impurity regions are formed in the semiconductor layers, respectively, through the processes above.

Next, the masks 450a to 450c made of resist are removed and a first interlayer insulating film 461 is formed thereon. The first interlayer insulating film 461 may be an insulating film containing silicon with a thickness of 100 to 200 nm, which is formed by plasma CVD method or sputtering method. In this embodiment, silicon oxynitride film with a thickness of 150 nm is formed by plasma CVD method. The first interlayer insulating film 461 is not limited to the silicon oxynitride film but may be the other insulating film containing silicon in a single layer or in a laminated layers.

Figure 7C:
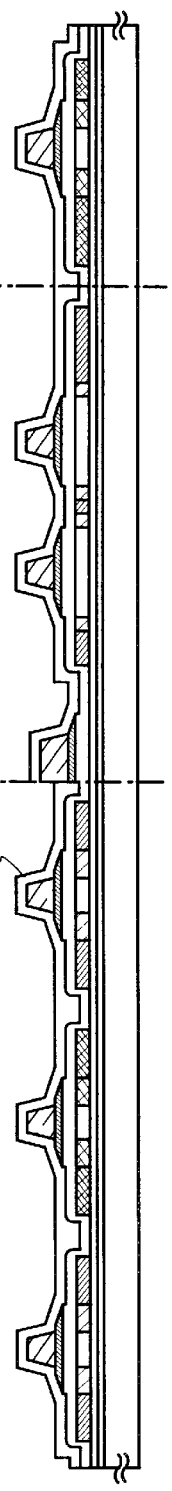

Next, as shown in FIG. 7C, a laser irradiation method is used as a activation treatment. In accordance with the present invention, the activation treatment may be performed by using a continuous oscillation type or pulse oscillation type excimer laser, YAG laser or the like. Further, thermal annealing method using an annealing furnace or rapid thermal annealing method (RTA method) may be applied to performing the activation treatment.

Alternatively, the activation treatment may be performed before the first interlayer insulating film is formed. However, when a wiring material in use is sensitive to heat, the activation process is preferably performed after an interlayer insulating film (insulating film mainly containing silicon such as silicon nitride film) for protecting the wirings etc. like this embodiment.

After the heating process (thermal process at 300 to 550° C. for one to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heating process in an atmosphere containing 3 to 100% of hydrogen at 300 to 450° C. for 1 to 12 hours.

Next, a second interlayer insulating film 462 formed by an inorganic insulating material or an organic insulating material is formed on the first interlayer insulating film 461. In this embodiment, an acrylic resin film with a thickness of 1.6 μm is formed, whose viscosity is 10 to 1000 cp, preferably 40 to 200 cp and which has depressions and projections formed on the surface.

In this embodiment, in order to prevent mirror reflection, a second interlayer insulating film having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same photomask for forming a TFT. Thus, the projecting portion can be formed without any increase in the number of steps. The projecting portion may be provided as necessary on the substrate in the pixel portion except for wirings and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as well known sand-blast method and etching method. Preferably, by preventing mirror reflection and by dispersing reflected light, the whiteness is increased.

Figure 8:
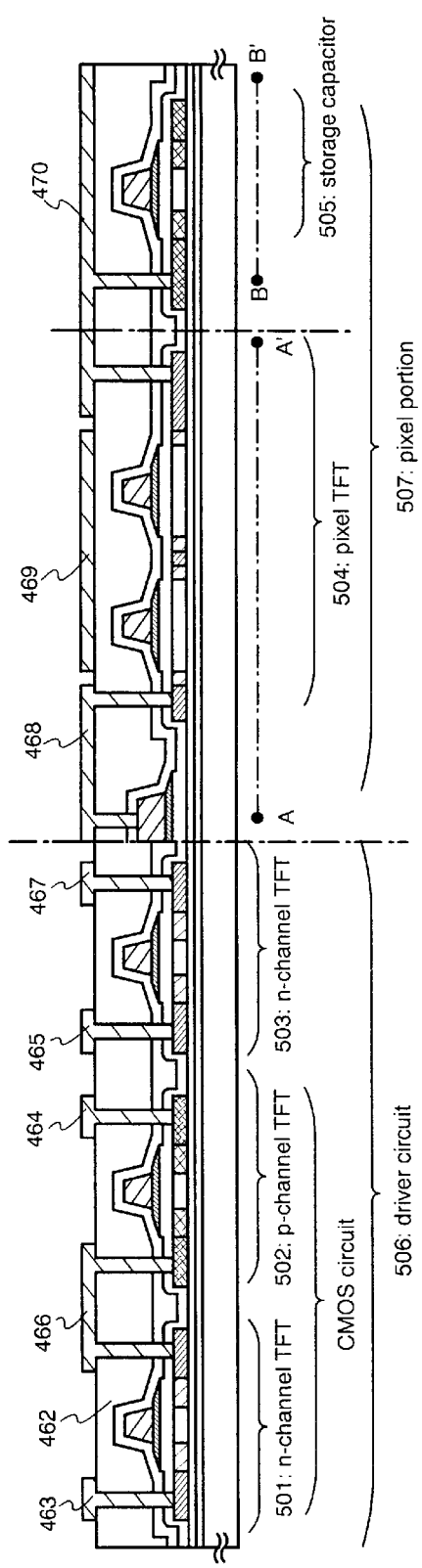
FIG. 8 is a sectional view showing the manufacturing process of a pixel TFT and driver circuit TFTs.

Wirings 463 to 468 electrically connecting to impurity regions, respectively, are formed in a driver circuit 506. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate layers including three or more layers. The materials of the wirings are not limited to Al and Ti. For example, the wiring can be formed by forming Al or Cu on a TaN film and then by patterning the laminate film in which a Ti film is formed (FIG. 8).

In a pixel portion 507, a pixel electrode 470, a gate wiring 469 and a connecting electrode 468 are formed. Source wirings (a laminate of layers 422*a* and 422*b*) are electrically connected with a pixel TFT by the connecting electrode 468. The gate wiring 469 is electrically connected with a gate electrode of the pixel TFT. A pixel electrode 470 is electrically connected with a drain region 442 of the pixel TFT. Furthermore, the pixel electrode 470 is electrically connected with a semiconductor layer 406 functioning as one electrode forming a storage capacitor. Desirably, a material having excellent reflectivity such as a film mainly containing Al or Ag or the laminate film is used for the pixel electrode 470.

In this way, the driver circuit 506 having a CMOS circuit including an n-channel type TFT 501 and a p-channel type TFT 502 and a n-channel type TFT 503, and the pixel portion 507 having the pixel TFT 504 and the storage capacitor 505 can be formed on the same substrate. Thus, an active matrix substrate is completed.

The n-channel type TFT 501 of the drive circuit 506 has a channel forming region 437, a low concentration impurity region 436 overlapping with the first conductive layer 428*a*, which constructs a part of the gate electrode, (GOLD region), and a high concentration impurity region 452 functioning as the source region or the drain region. The p-channel type TFT 502 forming a CMOS circuit together with the n-channel TFT 501, which are connected by an electrode 466, has a channel forming region 440, a high concentration impurity region 454 functioning as the source region or the drain region, and an impurity region 453 to which an n-type doping impurity element and a p-type doping impurity element are implanted. The n-channel type TFT 503 has a channel forming region 443, a low concentration impurity region 442 overlapping with the first conductive layer 430*a*, which constructs a part of the gate electrode, (GOLD region), and a high concentration impurity region 456 functioning as the source region or the drain region.

The pixel TFT 504 of the pixel portion has a channel forming region 446, a low concentration impurity region 445 formed outside of the gate electrode (LDD region), and a high concentration impurity region 458 functioning as the source region or the drain region. An n-type doping impurity element and a p-type doping impurity element are added to a semiconductor layer functioning as one electrode of the storage capacitor 505. The storage capacitor 505 is formed by an electrode (a laminate of layers 432*a* and 432*b*) and a semiconductor layer by using the insulating film 416 as a dielectric.

The pixel structure in this embodiment is arranged such that light can be blocked in a space between pixel electrodes and the ends of the pixel electrodes can overlap with the source wiring without using the black matrix.

Figure 9:
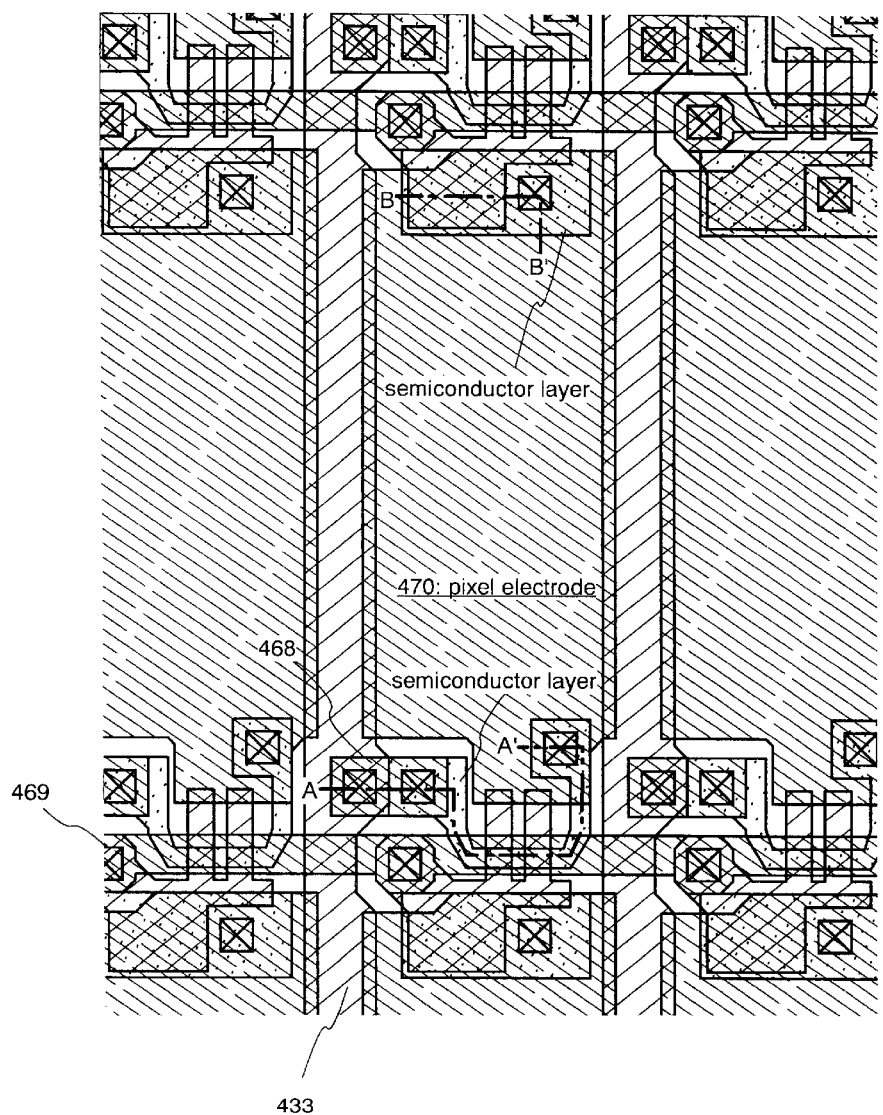
FIG. 9 is a top view of a structure of the pixel TFT.

FIG. 9 shows a top view of the pixel portion of the active matrix substrate manufactured in this embodiment. The same reference numerals are used for the corresponding parts in FIGS. 6 to 9. A broken line A–A' in FIG. 8 corresponds to a sectional view taken along a broken line A–A' in FIG. 9. A broken line B–B' in FIG. 8 corresponds to a sectional view taken along a broken line B–B' in FIG. 9.

It should be noted that this embodiment can be combined with any one of embodiments 1 to 4 freely.

As mentioned above, a thin film transistor having a high crystallinity and good characteristics can be obtained by using a semiconductor film formed by employing a method that laser lights emitted from laser oscillators are gathered by an optical system and irradiates the semiconductor film. Furthermore, a thin film transistor, wherein the irregularity is reduced, can be obtained by using a semiconductor film formed by employing the method of irradiating the laser light, which coherence is reduced, to the semiconductor film. The active matrix substrate including such thin film transistor can have a good operational characteristic and high reliability.

[Embodiment 6]

Figure 10:
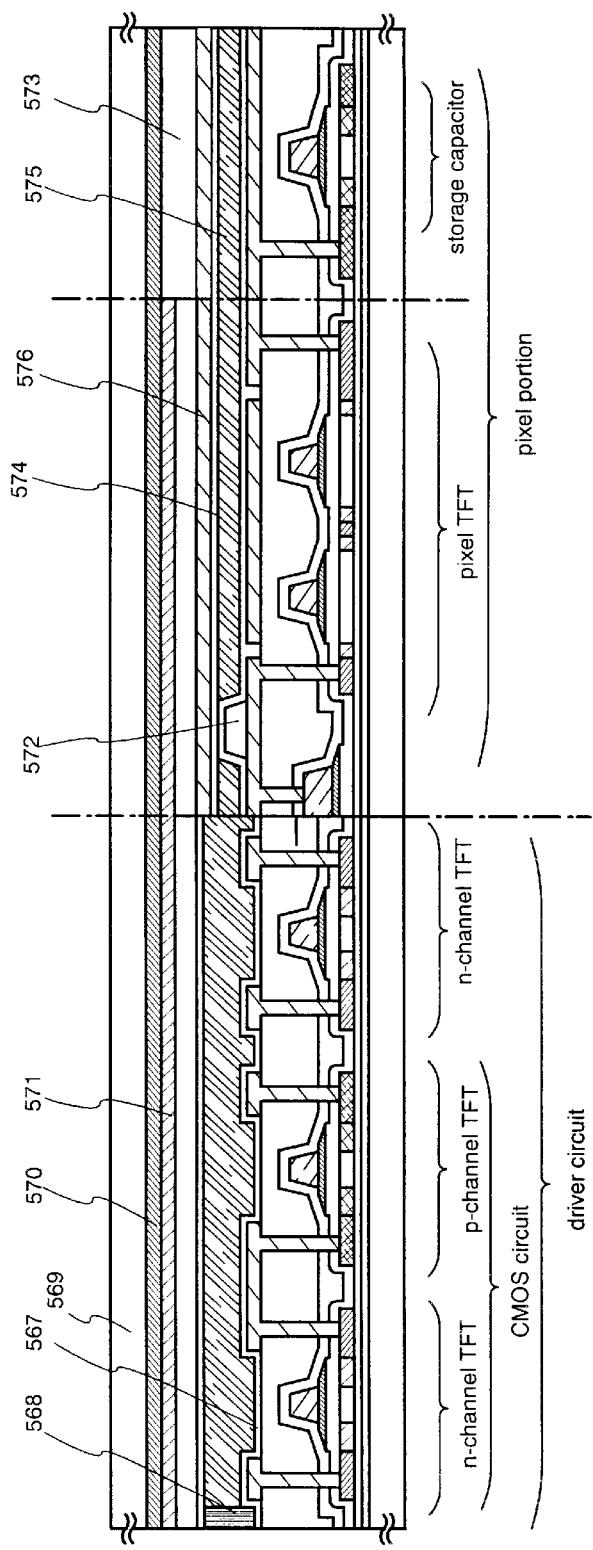
FIG. 10 is a sectional view of an active matrix liquid crystal display device.

This embodiment explains, below, a process to manufacture a reflection type liquid crystal display device from the active matrix substrate made in the Embodiment 5, using FIG. 10.

First, after obtaining an active matrix substrate in the state of FIG. 8 according to the Embodiment 5, an alignment film 567 is formed at least on the pixel electrodes 470 on the active matrix substrate of FIG. 8 and subjected to a rubbing process. Incidentally, in this embodiment, prior to forming the alignment film 567, an organic resin film such as an acryl resin film is patterned to form columnar spacers 572 in a desired position to support the substrates with spacing. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on the counter substrate 569. A shade portion is formed by overlapping a red coloring layer 570 and a blue coloring layer 571 together. Meanwhile, the shade portion may be formed by partly overlapping a red coloring layer and a green coloring layer.

In this embodiment is used a substrate shown in the Embodiment 5. Accordingly, in FIG. 9 showing a top view of the pixel portion of the Embodiment 5, there is a need to shade at least the gap between the gate wiring 469 and the pixel electrode 470, the gap between the gate wiring 469 and the connecting electrode 468 and the gap between the connecting electrode 468 and the pixel electrode 470. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 576 of a transparent conductive film is formed on the planarizing film 573 at least in the pixel portion. An alignment film 574 is formed over the entire surface of the counter substrate and subjected to a rubbing process.

Then, the active matrix substrate formed with the pixel portion and driver circuit and the counter substrate are bonded together by a sealing member 568. The sealing member 568 is mixed with filler so that the filler and the columnar spacers bond together the two substrates through an even spacing. Thereafter, a liquid crystal material 575 is poured between the substrates, and completely sealed by a sealing member (not shown). The liquid crystal material 575 may be a known liquid crystal material. In this manner, completed is a reflection type liquid crystal display device shown in FIG. 10. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured by the active matrix substrate including the above-mentioned semiconductor film can have a good operational characteristic and a high reliability. Thus, the liquid crystal display device as above can be used as a display portion for an electronic equipment in various kinds.

Incidentally, this embodiment can be freely combined with any one of Embodiments 1 to 5.

[Embodiment 7]

In this embodiment, a process for manufacturing an active matrix liquid crystal display device different from that shown in Embodiment 5 using the active matrix substrate manufactured in Embodiment 5 will be described. The description is made with reference to FIG. 11.

First, after the active matrix substrate with the state of FIG. 8 is obtained according to Embodiment 5, an alignment film 1067 is formed on the active matrix substrate of FIG. 8 to perform a rubbing process. Note that, in this embodiment, before the formation of the alignment film 1067, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate 1068 is prepared. A color filter in which a colored layer 1074 and a light shielding layer 1075 are arranged corresponding to each pixel is provided in this opposing substrate 1068. Also, a light shielding layer 1077 is provided in a portion of a driver circuit. A planarizing film 1076 for covering this color filter and the light shielding layer 1077 is provided. Next, a counter electrode 1069 made of a transparent conductive film is formed in a pixel portion on the planarizing film 1076, and then an alignment film 1070 is formed on the entire surface of the opposing substrate 1068 to perform a rubbing process.

Figure 11:
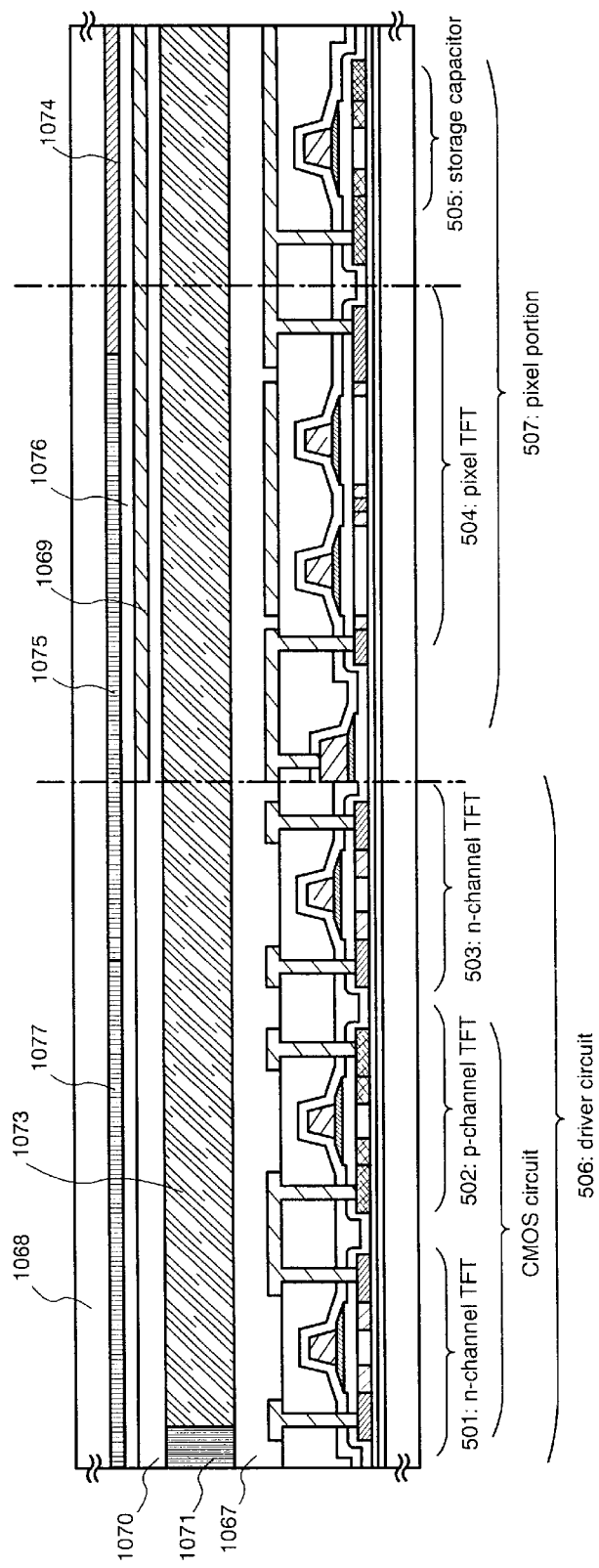
FIG. 11 is a sectional view of an active matrix liquid crystal display device.

Then, the active matrix substrate in which the pixel portion and the driver circuit are formed and the opposing substrate are adhered to each other by using a sealing member 1071. Filler is mixed with the sealing member 1071, and two substrates are adhered to each other with a uniform interval by this filler and the columnar spacer. After that, a liquid crystal material 1073 is injected into a space between both substrates and then completely encapsulated by a sealing member (not shown). A known liquid crystal material may be used as the liquid crystal material 1073. Thus, the active matrix liquid crystal display device as shown in FIG. 11 is completed. If necessary, the active matrix substrate or the opposing substrate is cut with a predetermined shape. Also, a polarization plate and the like are suitably provided using a known technique. And, an FPC is adhered to the active matrix liquid crystal display device using a known technique.

The liquid crystal display device manufactured by the active matrix substrate including the above-mentioned semiconductor film can have a good operational characteristic and a high reliability. Thus, the liquid crystal display device as above can be used as a display portion for an electronic equipment in various kinds.

This embodiment can be freely combined with any one of Embodiments 1 to 5.

[Embodiment 8]

In the present embodiment, an example of fabricating a light-emitting device will be described using the present invention. In the present specification, a light-emitting device collectively refers to a display panel in which a light-emitting element formed on a substrate is sealed between the substrate and a cover member and a display module in which an IC is mounted on the display panel. A light-emitting element includes a layer (light-emitting layer) containing an organic compound that allows luminescence generated by application of an electric field to be obtained (light emitting layer), an anode layer, and a cathode layer. Furthermore, luminescence in an organic compound includes light-emission (fluorescence) obtained when a singlet excited state returns to a normal state and light-emission (phosphorescence) obtained when a triplet excited state returns to a normal state. Either one of or both of emission light is included.

In the present specification, all the layers formed between an anode and a cathode in a light-emitting element are defined as organic light-emitting layers. Specifically, the organic light-emitting layers include a light-emitting layer, a hole injection layer, an electron injection layer, a hole transport layer, an electron transport layer, etc. A light-emitting element has a basic structure in which an anode layer, a light-emitting layer, and a cathode layer are successively stacked. In addition to the above-mentioned structure, the light-emitting element may have a structure in which an anode layer, a hole injection layer, a light-emitting layer, and a cathode layer are successively stacked, a structure in which an anode layer, a hole injection layer, a light-emitting layer, an electron transport layer, and a cathode layer are successively stacked, etc.

Figure 12:
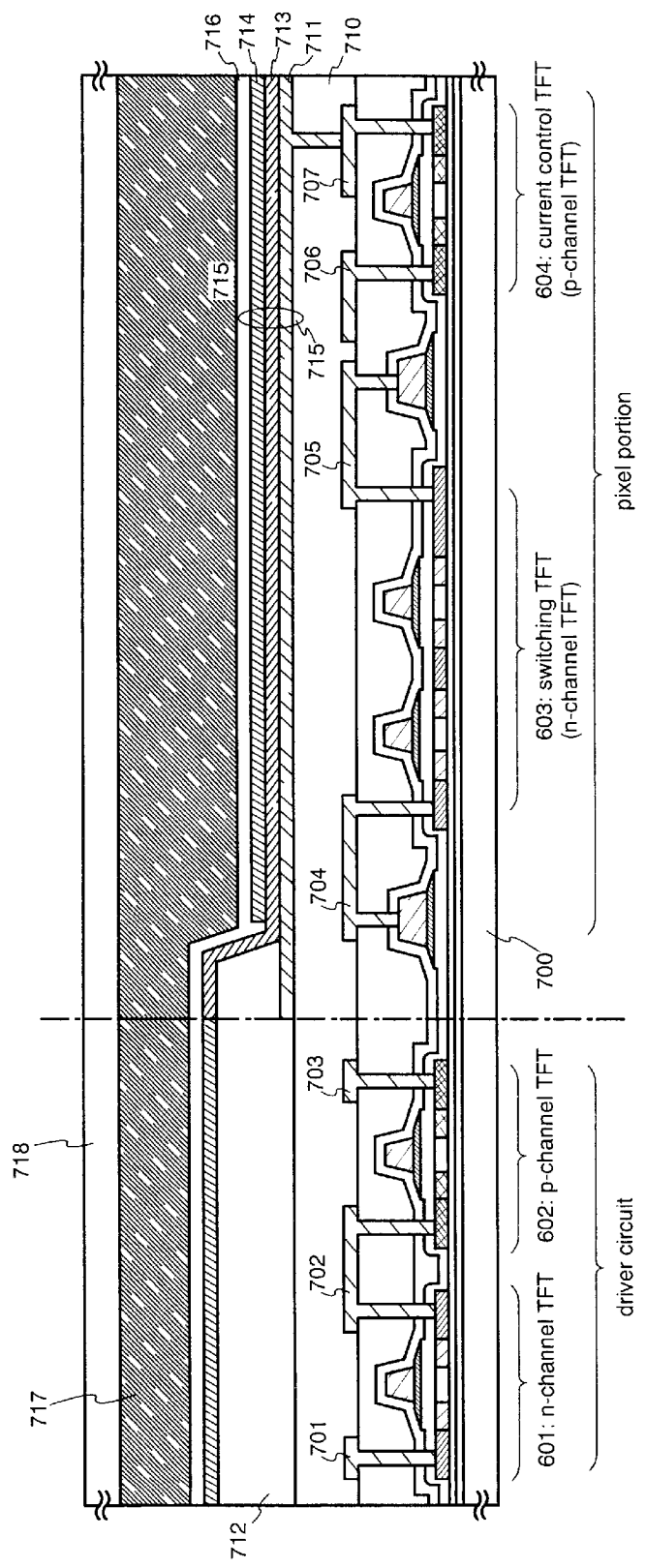
FIG. 12 is a sectional structural view of a driver circuit and a pixel portion of a light emitting device.

FIG. 12 is a cross-sectional view of a light-emitting device of the present embodiment. In FIG. 12, a switching TFT 603 provided on a substrate 700 is formed by using the n-channel type TFT 503 in FIG. 8. Regarding the configuration of the switching TFT 603, the description of the n-channel type TFT 503 may be referred to.

Although the present embodiment shows a double-gate structure in which two channel-formation regions are formed, a single-gate structure in which one channel-formation region is formed or a triple-gate structure in which three channel-formation regions are formed may be used.

A driver circuit provided on the substrate 700 is formed by using the CMOS circuit shown in FIG. 8. Therefore, regarding the description of the configuration of the driver circuit, the description of the n-channel type TFT 501 and the p-channel type TFT 502 may be referred to. Although the present embodiment shows a single-gate structure, a double-gate structure or a triple-gate structure may be used.

Furthermore, wirings 701 and 703 function as source wirings of a CMOS circuit, and a wiring 702 functions as a drain wiring. A wiring 704 functions as a wiring for electrically connecting a source wiring 708 to a source region of a switching TFT, and a wiring 705 functions as a wiring for electrically connecting a drain wiring 709 to a drain region of a switching TFT.

A current control TFT 604 is formed by using the p-channel type TFT 502 in FIG. 8. Therefore, regarding the description of the current control TFT 604, the description of the p-channel TFT 502 may be referred to. Although the present embodiment shows a single-gate structure, a double-gate substrate or a triple-gate structure may be used.

A wiring 706 is a source line (corresponding to a current supply line) of the current control TFT 604, and reference numeral 707 denotes an electrode that is electrically connected to a pixel electrode 711 by being overlapped with the pixel electrode 711 of the current control TFT.

Reference numeral 711 is a pixel electrode (an anode of a light-emitting element), made of a transparent conductive film. As the transparent conductive film, a compound of indium oxide and tin oxide, a compound of indium oxide and zinc oxide, zinc oxide, tin oxide, or indium oxide can be used. The transparent conductive film with gallium added thereto may be used. The pixel electrode 711 is formed on a flat interlayer insulating film 710 before forming the above-mentioned wiring. In the present embodiment, it is very important to flatten the step difference caused by TFTs by using a planarizing film 710 made of a resin. A light-emitting layer to be formed later is very thin, so that light-emission defects may be caused due to the presence of the step difference. Therefore, it is desirable that the surface is flattened before forming pixel electrodes so that the light-emitting layer can be formed on a flat surface.

After the wirings 701 to 707 are formed, a bank 712 is formed as shown in FIG. 12. The bank 712 may be formed by patterning an insulating film or an organic resin film with a thickness of 100 to 400 nm containing silicon.

Since the bank 712 is made of an insulating film, attention should be paid to electrostatic breakdown of element during film formation. In the present embodiment, a resistivity is decreased by adding carbon particles or metal particles to an insulating film to be a material for the bank 712, whereby static electricity is suppressed. At this time, the adding amount of carbon particles or metal particles may be regulated so that the resistance ratio becomes $1 \times 10^6$ to $1 \times 10^{12}$ $\Omega$m (preferably $1 \times 10^8$ to $1 \times 10^{10}$ $\Omega$m).

A light-emitting layer 713 is formed on the pixel electrode 711. Although one pixel is shown in FIG. 12, light-emitting layers are formed so as to correspond to R (red), G (green), and B (blue) in the present embodiment. Furthermore, in the present embodiment, a low molecular-weight organic light-emitting material is formed by vapor deposition. More specifically, a layered structure is used in which copper phthalocyanine (CuPc) film with a thickness of 20 nm is provided as a hole injection layer, and a tris-8-quinolinolatoaluminum complex ($Alq_3$) film with a thickness of 70 nm is provided as a light-emitting layer on the hole injection layer. By adding fluorochrome such as quinacridon, perylene, or DCM1 to $Alq_3$, a light-emission color can be controlled.

It should be noted that an exemplary organic light-emitting material, which can be used as a light-emitting layer, has been described in the above, but the present embodiment is not limited thereto. A light-emitting layer (for emitting light and moving carriers for light emission) may be formed by arbitrarily combining a light-emitting layer, a charge transport layer, or a charge injection layer. In the present embodiment, a low molecular-weight organic light-emitting material is used as a light-emitting layer, however, an intermediate molecular-weight organic light-emitting material or a high molecular-weight organic light-emitting material may be used. In this specification, an intermediate molecular weight organic light-emitting material can be defined that an aggregate of an organic electroluminescent material which does not have subliming property or dissolving property (preferably, an aggregate which has molecularity of 20 or less), or an organic electroluminescent material (referred to as intermediate molecular weight organic electroluminescent material) which has a molecular chain length of 10 $\mu$m or less (preferably 50 nm or less). Furthermore, as an example using a high molecular-weight organic light-emitting material, a layered structure may be used in which a polythiophene (PEDOT) film with a thickness of 20 nm is provided as a hole injection layer by spin coating, and a paraphenylene vinylene (PPV) film with a thickness of about 100 nm is provided on the hole injection layer as a light-emitting layer. When $\pi$-conjugated type polymer of PPV is used, a light-emission wavelength from red to blue can be selected. Furthermore, it is also possible to use an inorganic material such as silicon carbide as a charge transfer layer or a charge injection layer. As the organic light-emitting material and inorganic material, known materials can be used.

Next, a cathode 714 made of a conductive film is provided on the light-emitting layer 713. In the present embodiment, an alloy film of aluminum and lithium is used as a conductive film. Needless to say, a known MgAg film (alloy film of magnesium and silver) may be used. As a material for a cathode, a conductive film made of an element belonging to Group 1 or Group 2 of the periodic table, or a conductive film with these elements added thereto may be used.

When the cathode 714 is formed, a light-emitting element 715 is completed. The light-emitting element 715 herein refers to a diode formed of the pixel electrode (anode) 711, the light-emitting layer 713, and the cathode 714.

It is effective that a passivation film 716 is provided so as to completely cover the light-emitting element 715. As the passivation film 716, a single-layered structure or a multi-layered structure of an insulating film including a carbon film, a silicon nitride film, or a silicon oxynitride film is used.

In this case, a film with satisfactory coverage is preferably used as the passivation film. It is effective to use a carbon film, particularly, DLC (diamond-like carbon) film. Since the DLC film can be formed in a temperature range from room temperature to 100° C., the DLC film can be easily formed even above the light-emitting layer 713 with low heat resistance. Furthermore, due to a high blocking effect with respect to oxygen, the DLC film can suppress oxidation of the light-emitting layer 713. Therefore, the light-emitting layer 713 can be prevented from being oxidized while the subsequent sealing process is conducted.

Furthermore, a sealing member 717 is provided on the passivation film 716, and a cover member 718 is attached to the sealing member 717. As the sealing member 717, a UV-curable resin may be used, and it is effective to provide a material having moisture absorption effect or a material having an antioxidant effect in the sealing member 717. Furthermore, in the present embodiment, as the cover member 718, a glass substrate, a quartz substrate, or a plastic substrate (including a plastic film) with a carbon film (preferably, a DLC film) formed on both sides thereof is used.

Accordingly, a light-emitting device having a configuration as shown in FIG. 12 is completed. It is effective that the process, in which the passivation film 716 is formed after the bank 712 is formed, is continuously conducted without being exposed to the atmosphere in a film-formation apparatus of a multi-chamber type (or an in-line type). It is also possible that the process up to the attachment of the cover member 718 is conducted continuously without being exposed to the air.

Therefore, n-channel TFT 601, n-channel TFT 602, a switching TFT (n-channel TFT) 603 and a current control TFT (n-channel TFT) 604 are formed on the substrate 700.

Furthermore, as described with reference to FIG. 12, by providing impurity regions overlapped with a gate electrode via an insulating film, an n-channel TFT that is unlikely to be degraded due to a hot-carrier effect can be formed. Therefore, a highly reliable light-emitting device can be realized.

In the present embodiment, only the configurations of a pixel portion and a driver circuit are shown. However, in accordance with the manufacturing processes of the present embodiment, logic circuits such as a signal division circuit, a D/A converter, an operational amplifier, and a y-correction circuit can be formed on the same insulator. Furthermore, even a memory and a microprocessor can be formed.

The light-emitting device of the present embodiment after the sealing (or encapsulation) process for protecting a light-emitting element is conducted will be described with reference to FIGS. 13A and 13B. If required, reference numerals used in FIG. 12 will be cited.

FIG. 13A is a top view showing a state in which sealing of a light-emitting element is completed. FIG. 13B is a cross-sectional view taken along a line C–C' in FIG. 13A. Portions surrounded by dotted lines and denoted with reference numerals 801, 806, and 807 are a source-side driver circuit, a pixel portion, and a gate-side driver circuit, respectively. Reference numeral 901 denotes a cover member, 902 denotes a first sealing member, 903 denotes a second sealing member, and a sealing member 907 is provided in an inner portion surrounded by the sealing member 902.

Reference numeral 904 denotes wiring for transmitting a signal input to the source-side driver circuit 801 and the gate-side driver circuit 807 and receiving a video signal and a clock signal from a flexible printed circuit (FPC) 905 to be an external input terminal. Herein, although only an FPC is shown, a printed wiring board (PWB) may be attached to the FPC. The light-emitting device in the present specification includes not only a light-emitting device itself but also a light-emitting device with an FPC or a PWB.

Next, a cross-sectional configuration will be described with reference to FIG. 13B. The pixel portion 806 and the gate-side driver circuit 807 are formed over the substrate 700. The pixel portion 806 is composed of the current control TFT 604 and a plurality of pixels including a pixel electrode 711 electrically connected to a drain of the current control TFT 604. Furthermore, the gate-side driver circuit 807 is composed of a CMOS circuit (see FIG. 14) obtained by combining the n-channel TFT 601 with the p-channel TFT 602.

The pixel electrode 711 functions as an anode of a light-emitting element. Banks 712 is formed at both ends of the pixel electrode 711, and a light-emitting layer 713 and a cathode 714 of a light-emitting element are formed on the pixel electrode 711.

The cathode 714 functions as wiring common to all the pixels, and is electrically connected to the FPC 905 via the connection line 904. Furthermore, all the elements contained in the pixel portion 806 and the gate-side driver circuit 807 are covered with the cathode 714 and the passivation film 716.

The cover member 901 is attached with the first sealing member 902. Spacers made of a resin film may be provided so as to ensure a gap between the cover member 901 and the light-emitting element. An inner portion of the first sealing member 902 is filled with the sealing member 907. An epoxy resin is preferably used for the first sealing member 902 and the sealing member 907. It is desirable that the first sealing member 902 is unlikely to transmit moisture and oxygen. Furthermore, the sealing member 907 may contain a material having moisture absorption effect and an antioxidant effect.

The sealing member 907 provided so as to cover the light-emitting element also functions as an adhesive for attaching the cover member 901. In the present embodiment, as a material for a plastic substrate 901a constituting the cover member 901, fiberglass-reinforced plastics (FRP), polyvinyl fluoride (PVF), Mylar, polyester, or acrylic resin can be used Furthermore, after the cover member 901 is attached with the sealing member 907, a second sealing member 903 is provided so as to cover the side surfaces (exposed surfaces) of the sealing member 907. The second sealing member 903 can be made of the same material as that for the first sealing member 902.

By sealing the light-emitting element with the sealing member 907 in the above-mentioned configuration, the light-emitting element can be completely shut off from the outside, whereby a material accelerating degradation of the light-emitting layer due to oxidation, such as moisture and oxygen, can be prevented from entering from the outside. Thus, a highly reliable light-emitting device is obtained.

The light-emitting device manufactured by the active matrix substrate including the semiconductor film as mentioned above can provide good operational characteristic and high reliability. Furthermore, the high reliable light-emitting device can be used as a display portion of various electronic equipment.

Incidentally, present embodiment can be freely combined with any one of Embodiments 1 to 5.

[Embodiment 9]

Figure 14:
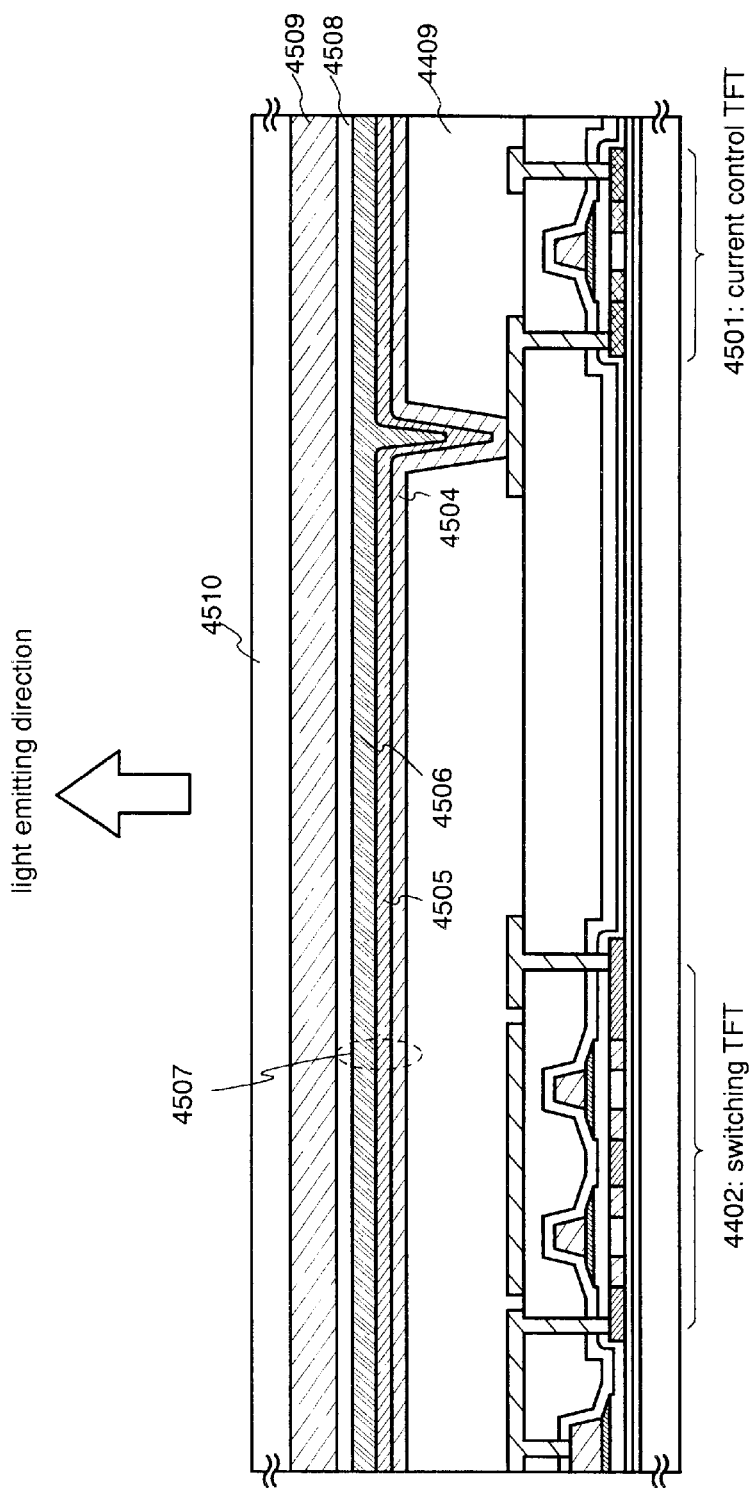
FIG. 14 is a sectional structural view of a pixel portion of a light emitting device.

In this embodiment, a light-emitting device having a pixel structure different from Embodiment 8 will be described. FIG. 14 is used for the description.

In FIG. 14, a TFT having the same structure as the n-channel TFT 501 shown in FIG. 8 is used as a current control TFT 4501. Of course, the gate electrode of the current control TFT 4501 is electrically connected with a drain wiring of a switching TFT 4402. Also, the drain wiring of the current control TFT 4501 is electrically connected with a pixel electrode 4504.

In this embodiment, the pixel electrode 4504 made from a conductive film serves as the cathode of the light emitting element. Concretely, an alloy film of aluminum and lithium is used. A conductive film made of an element belonging to the group 1 or the group 2 of the periodic table or a conductive film to which the element is added is preferably used.

A light emitting layer 4505 is formed on the pixel electrode 4504. Note that, although only one pixel is shown in FIG. 14, a light emitting layer corresponding to G (green) is formed by an evaporation method and a coating method (preferably, a spin coating method) in this embodiment. Concretely, a laminate structure is used such that a lithium fluoride (LiF) film having a thickness of 20 nm is provided as an electron injection layer and a PPV (polyparaphenylenevinylene) film having a thickness of 70 nm is provided thereon as the light emitting layer.

Then, an anode 4506 made from a transparent conductive film is provided on the light emitting layer 4505. In the case of this embodiment, a conductive film made of a compound of indium oxide and tin oxide or a compound of indium oxide and zinc oxide is used as the transparent conductive film.

When the anode 4506 is formed, a light emitting element 4507 is completed. Note that the light emitting element 4507 described here indicates a diode composed of the pixel electrode (cathode) 4504 formed on an interlayer insulating film 4409, the light emitting layer 4505, and the anode 4506.

It is effective to provide a passivation film 4508 so as to completely cover the light emitting element 4507. The passivation film 4508 is made from an insulating film including a carbon film, a silicon nitride film, or a silicon oxynitride film and used as a single layer of the insulating film or a laminate as a combination thereof.

Further, a sealing member 4509 is provided on the passivation film 4508 and a cover member 4510 is bonded thereto. An ultraviolet curable resin is preferably used as the sealing member 4509 and it is effective to provide a material having a moisture absorption effect or a material having an antioxidant effect in the inner portion. In this embodiment, a glass substrate, a quartz substrate, or a plastic substrate (including a plastic film), in which a carbon film (preferably, a diamond-like carbon film) is formed on both surfaces is used as the cover member 4510.

The light-emitting device manufactured by the active matrix substrate including the semiconductor film as mentioned above can provide good operational characteristic and high reliability. Furthermore, the high reliable light-emitting device can be used as a display portion of various electronic equipment.

Note that this embodiment can be freely combined with any one of Embodiments 1 to 5.

[Embodiment 10]

In the present embodiment, an exemplary liquid crystal display device according to the present invention will be described in which a TFT configuration is different from that of the active matrix substrate manufactured in Embodiment 5.

Figure 15A:
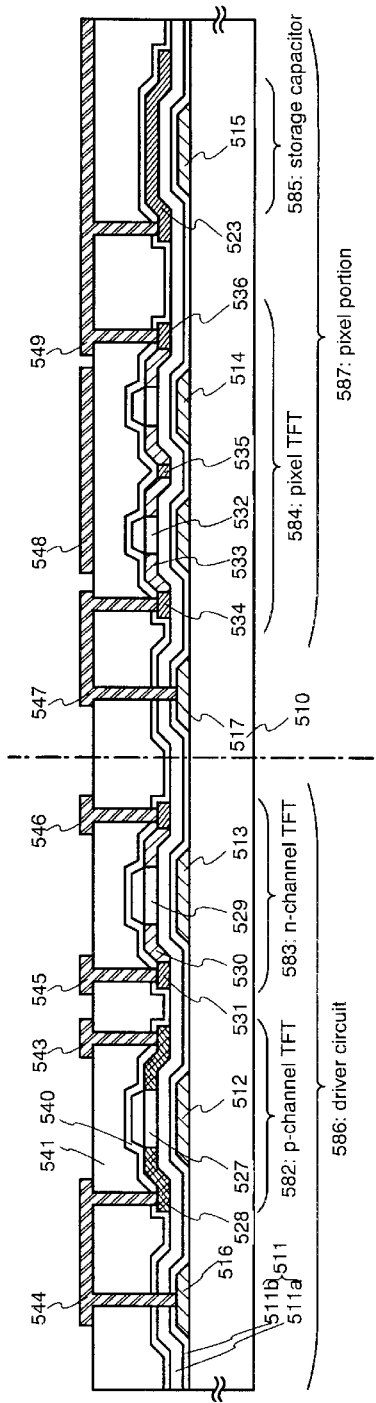
FIGS. 15A and 15B are sectional views of an active matrix liquid crystal display device.

On an active matrix substrate shown in FIG. 15A, a driver circuit 586 having an n-channel TFT 583 and a p-channel TFT 582, and a pixel portion 587 having a pixel TFT 584 and a storage capacitor 585 are formed.

These TFTs are obtained by forming gate wirings 512 to 517 on a substrate 510, forming insulating films 511a and 511b on the gate wirings, and providing channel forming regions, source regions, drain regions, LDD regions, and the like in a semiconductor layer on the insulating film. The semiconductor layer is formed according to the present invention in the same way as in Embodiments 1 to 4.

The gate wirings 512 to 517 are formed to have a thickness of 200 to 400 nm, preferably 250 nm, such that the edges of the gate wirings 512 to 517 are tapered so as to enhance step coverage of a coating film to be formed on upper layers thereof. The gate wirings 512 to 517 are formed such that the taper angle becomes 5° to 30°, preferably 15° to 25°. The taper portions are formed by dry etching, and the angle thereof is controlled with an etching gas and a bias voltage applied to the substrate side.

Furthermore, impurity regions are formed in first to third doping processes. First, the first doping process is conducted, whereby an LDD (light doped drain) region of an n-channel TFT is formed. Doping may be conducted by ion doping or ion implantation. Phosphorus (P) is added as an impurity element imparting n-type (donor), and first impurity regions are formed with a mask. Then, a mask is newly formed so as to cover the LDD region of the n-channel TFT, whereby a source region and a drain region of the n-channel TFT are formed during the second doping process.

In the third doping process, a source region and a drain region of a p-channel TFT are formed. Doping is conducted only by adding an impurity element imparting p-type (acceptor) by ion doping or ion implantation. At this time, the semiconductor layer in which an n-channel TFT is to be formed is covered with a mask, so that the impurity element imparting p-type will not be added to the semiconductor layer. In the present embodiment, although an LDD region is not manufactured in the p-channel TFT, the LDD region may be provided.

Thus, in the n-channel TFT 583, LDD regions 530 and a source region or a drain region 531 are formed outside of a channel forming region 529. A p-channel TFT 582 also has the same configuration and is composed of a channel forming region 527, and a source region or a drain region 528. In the present embodiment, a single-gate structure is used; however, a double-gate structure or a triple-gate structure may be used.

In the pixel portion 587, the pixel TFT 584 formed of an n-channel TFT has a multi-gate structure for the purpose of reducing an OFF-current, and an LDD region 533, and a source region or a drain region 534 are provided outside of a channel forming region 532.

An interlayer insulating film is composed of a first interlayer insulating film 540 with a thickness of 50 to 500 nm made of an inorganic material such as silicon oxide, silicon nitride, or silicon oxynitride, and a second interlayer insulating film 541 made of an organic insulating material such as polyimide, acrylic resin, polyimideamide, and benzocyclobutene (BCB). Thus, by forming the second interlayer insulating film of an organic insulating material, the surface of the interlayer insulating film can be satisfactorily flattened. An organic resin material generally has a low dielectric constant, so parasitic capacitance can be reduced. However, the organic resin material is not suitable as a protective film due to its moisture absorption effect, so it is preferably combined with the first interlayer insulating film 540.

Thereafter, a resist mask with a predetermined pattern is formed, and contact holes reaching a source region or a drain region formed in each semiconductor layer are formed. The contact holes are formed by dry etching. In this case, the second interlayer insulating film 541 made of an organic resin material is first etched using a mixed gas of $CF_4$, $O_2$, and He as an etching gas, and thereafter, the first interlayer insulating film 540 is etched using $CF_4$ and $O_2$ as an etching gas.

Then, a conductive metal film is formed by sputtering or vacuum vapor evaporation. A resist mask pattern is formed, and wirings 543 to 549 are formed by etching. Thus, an active matrix substrate can be formed.

Figure 15B:
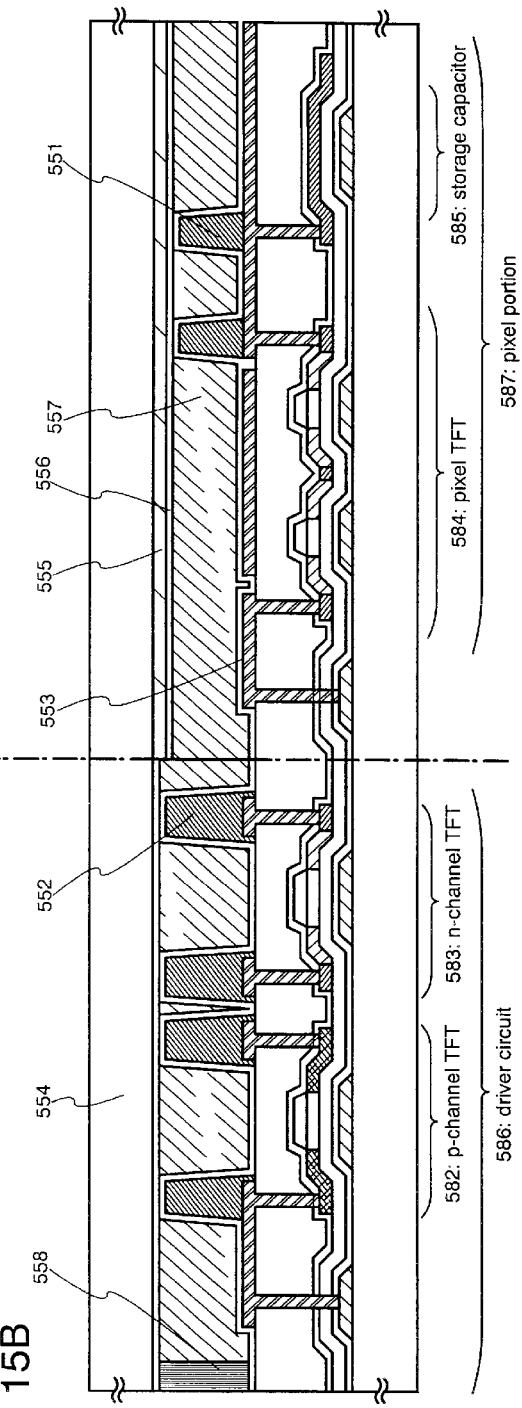

The process of manufacturing an active matrix type liquid crystal display device using the active matrix substrate in FIG. 15A will be described. FIG. 15B shows a state in which the active matrix substrate is attached to a counter substrate 554 with a sealing member 558. First, column-shaped spacers 551 and 552 are formed on the active matrix substrate shown in FIG. 15A. The spacers 551 provided in the pixel portion are formed so as to be overlapped with a contact portion on the pixel electrode. Although varied depending upon a liquid crystal material 557 to be used, the height of the spacers is set to be 3 to 10 μm. In the contact portion, concave portions are formed corresponding to the contact holes. Therefore, by forming the spacers such that they are aligned with the concave portions, orientation of liquid crystal can be prevented from being disturbed. Thereafter, an alignment film 553 is formed, and a rubbing treatment is conducted. A transparent conductive film 555 and an alignment film 556 are formed on the counter substrate 554. Then, the active matrix substrate and the counter substrate are attached to each other, and liquid crystal is injected therebetween.

The light-emitting device manufactured by the active matrix substrate including the semiconductor film as mentioned above can provide good operational characteristic and high reliability. Furthermore, the high reliable light-emitting device can be used as a display portion of various electronic equipment.

The present embodiment can be arbitrarily combined with any one of Embodiments 1 to 5.

[Embodiment 11]

Present embodiment will be described in which a light-emitting device is manufactured using the active matrix substrate described in Embodiment 10.

Figure 16:
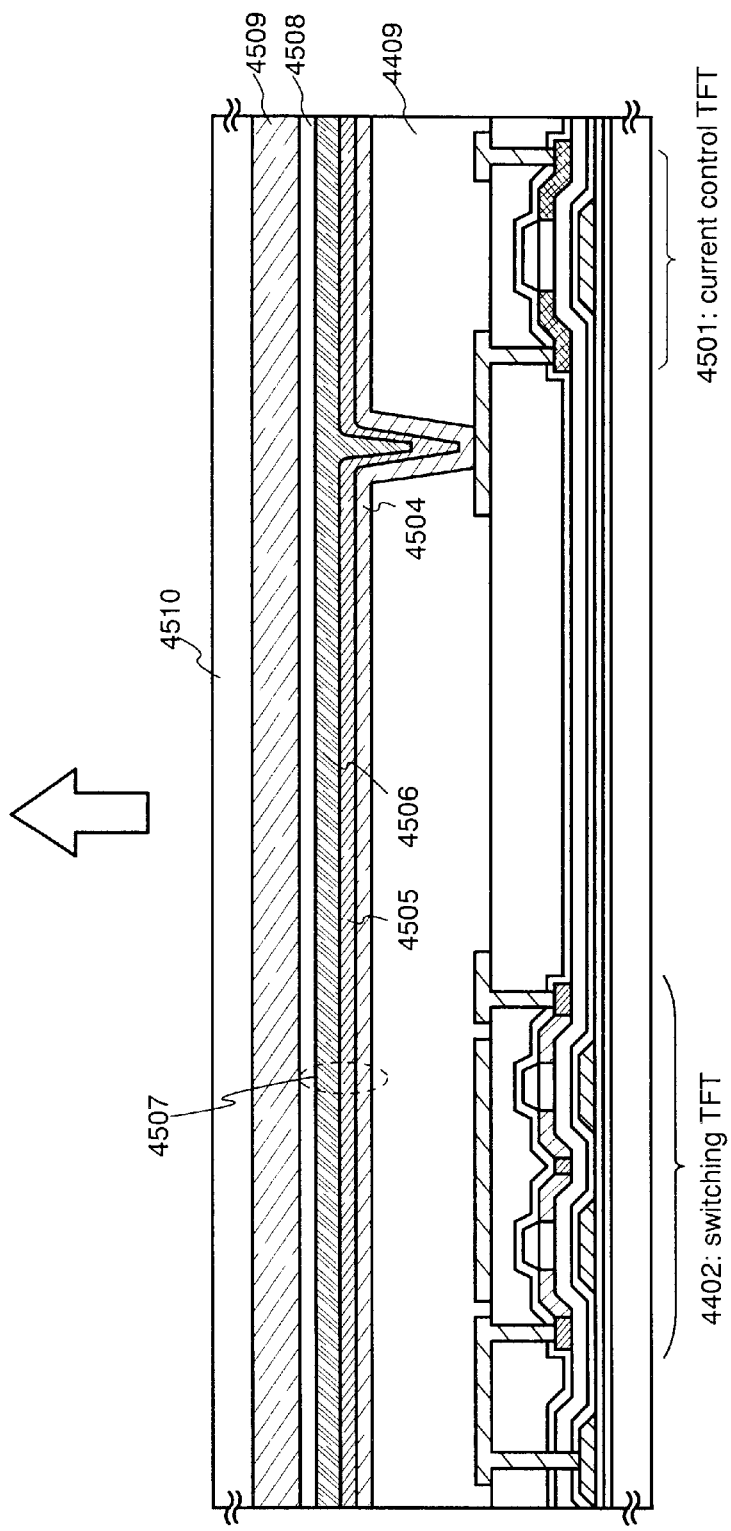
FIG. 16 is a sectional structural view of a pixel portion of a light emitting device.

In FIG. 16, as a current control TFT 4501, a TFT having the same configuration as that of the n-channel TFT 583 in FIG. 15 is used. Needless to say, a gate electrode of the current control TFT 4501 is electrically connected to a drain wiring of a switching TFT 4402. A drain wiring of the current control TFT 4501 is electrically connected to a pixel electrode 4504.

In the present embodiment, the pixel electrode 4504 made of a conductive film functions as a cathode of a light-emitting element. More specifically, an alloy film of aluminum and lithium is used. A conductive film made of an element belonging to Group 1 or 2 in the periodic table or a conductive film with the element added thereto may be used.

A light-emitting layer 4505 is formed on the pixel electrode 4504. In FIG. 16, only one pixel is shown. A light-emitting layer corresponding to G (green) is formed by vapor deposition and coating (preferably, spin coating) in the present embodiment. More specifically, a layered structure is used, in which a lithium fluoride (LiF) film with a thickness of 20 nm is provided as an electron injection layer, and a PPV (polyparaphenylene vinylene) film with a thickness of 70 nm is provided thereon as a light-emitting layer.

Next, an anode 4506 made of a transparent conductive film is provided on the light-emitting layer 4505. In the present embodiment, a conductive film made of a compound of indium oxide and tin oxide or a compound of indium oxide and zinc oxide is used.

When the anode 4506 is formed, a light-emitting element 4507 is completed. The light-emitting element 4507 refers to a diode composed of the pixel electrode (cathode) 4504, the light-emitting layer 4505, and the anode 4506.

It is effective that a passivation film 4508 is provided so as to completely cover the light-emitting element 4507. As the passivation film 4508, a single-layered structure or a multi-layered structure of an insulating film including a carbon film, a silicon nitride film, or a silicon oxynitride film is used.

Furthermore, a sealing member 4509 is provided on the passivation film 4508, and a cover member 4510 is attached to the sealing member 4509. As the sealing member 4509, ultraviolet curable resin may be used, and it is effective to provide a material having moisture absorption effect or a material having an antioxidant effect in the sealing member 4509. Furthermore, in the present embodiment, as the cover member 4510, a glass substrate, a quartz substrate, or a plastic substrate (including a plastic film) with a carbon film (preferably, a DLC film) formed on both sides thereof is used.

The light-emitting device manufactured by the active matrix substrate including the semiconductor film as mentioned above can provide good operational characteristic and high reliability. Furthermore, the high reliable light-emitting device can be used as a display portion of various electronic equipments.

The present embodiment can be arbitrarily combined with any one of embodiments 1 to 5.

[Embodiment 12]

Various electronic apparatuses (active matrix type liquid crystal display device, active matrix type light emitting device and active matrix type EC display device) can be formed by applying the present invention. That is, the present invention can be applied to various electronic devices incorporating these electro-optical devices into the display portion.

As such electronic apparatus, there are pointed out a video camera, a digital camera, a projector, a head mount display (goggle type display), a car navigation system, a car stereo, a personal computer, a portable information terminal (mobile computer, portable telephone, electronic book or the like) and the like. Examples of these are shown in FIGS. 17A–17F, 18A–18D, and 19A–19C.

FIG. 17A shows a personal computer including a main body 3001, an image input portion 3002, a display portion 3003, a keyboard 3004 and the like. The present invention can be applied to the display portion 3003.

FIG. 17B shows a video camera including a main body 3101, a display portion 3102, a voice input portion 3103, operation switches 3104, a battery 3105, an image receiving portion 3106 and the like. The present invention can be applied to the display portion 3102.

FIG. 17C shows a mobile computer including a main body 3201, a camera portion 3202, an image receiving portion 3203, an operation switch 3204, a display portion 3205 and the like. The present invention can be applied to the display portion 3205.

FIG. 17D shows a goggle type display including a main body 3301, a display portion 3302, an arm portion 3303 and the like. The present invention can be applied to the display portion 3302.

FIG. 17E shows a player using a record medium recorded with programs (hereinafter, referred to as record medium) including a main body 3401, a display portion 3402, a speaker portion 3403, a record medium 3404, an operation switch 3405 and the like. The player uses DVD (Digital Versatile Disc), CD or the like as the record medium and can enjoy music, enjoy movie and carry out game or Internet. The present invention can be applied to the display portion 3402.

FIG. 17F shows a digital camera including a main body 3501, a display portion 3502, an eye contact portion 3503, operation switches 3504, an image receiving portion (not illustrated) and the like. The present invention can be applied to the display portion 3502.

Figure 18A:
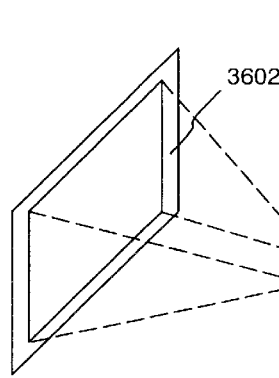
FIGS. 18A to 18D are examples of semiconductor devices.

FIG. 18A shows a front type projector including a projection apparatus 3601, a screen 3602 and the like. The present invention can be applied to the liquid crystal display device 3808 forming a part of the projection apparatus 3601 and other driver circuits.

Figure 18B:
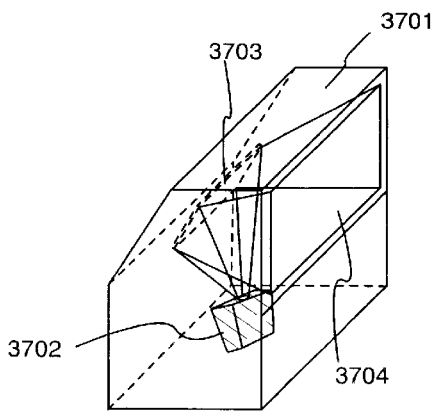

FIG. 18B shows a rear type projector including a main body 3701, a projection apparatus 3702, a mirror 3703, a screen 3704 and the like. The present invention can be applied to the liquid crystal display device 3808 forming a part of the projection apparatus 3702 and other driver circuits.

Figure 18C:
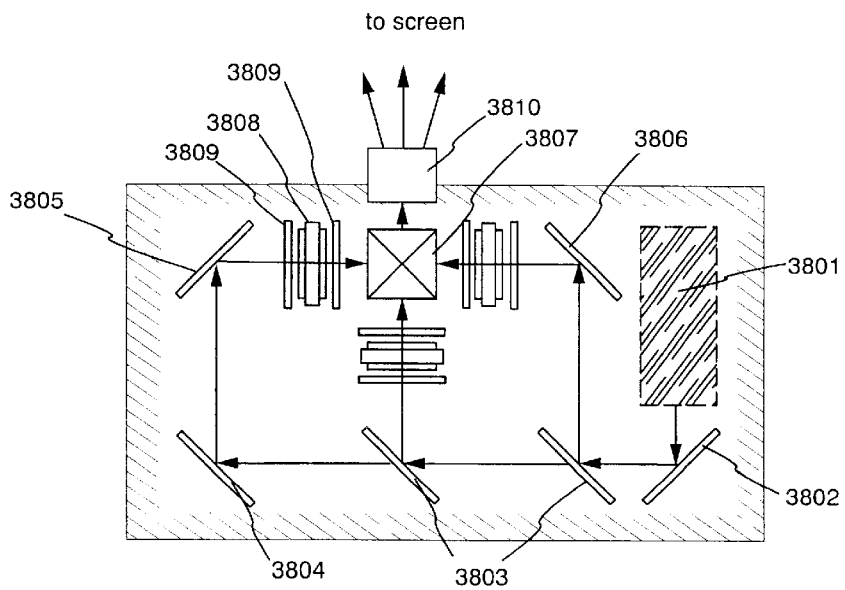

Further, FIG. 18C is a view showing an example of a structure of the projection apparatus 3601 and 3702 in FIG. 18A and FIG. 18B. The projection apparatus 3601 or 3702 is constituted by a light source optical system 3801, mirrors 3802, and 3804 through 3806, a dichroic mirror 3803, a prism 3807, a liquid crystal display device 3808, a phase difference plate 3809 and a projection optical system 3810. The projection optical system 3810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 18C.

Figure 18D:
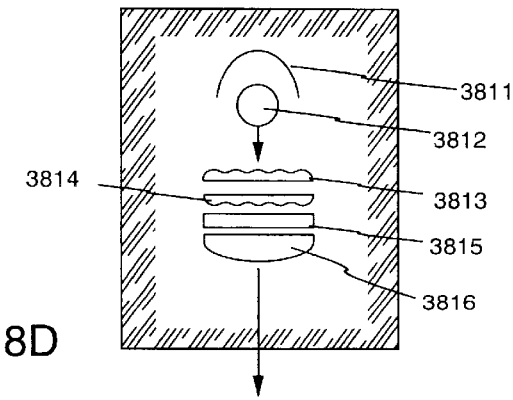

Further, FIG. 18D is a view showing an example of a structure of the light source optical system 3801 in FIG. 18C. According to this embodiment, the light source optical system 3801 is constituted by a reflector 3811, a light source 3812, lens arrays 3813 and 3814, a polarization conversion element 3815 and a focusing lens 3816. Further, the light source optical system shown in FIG. 18D is only an example and this example is not particularly limited thereto. For example, a person of executing this example may pertinently provide an optical system such as an optical lens, a film having a polarization function, a film for adjusting a phase difference or an IR film in the light source optical system.

However, according to the projectors shown in FIG. 18, there is shown a case of using a transmission type electro-optical device and an example of applying a reflection type electro-optical device or light emitting device are not illustrated.

Figure 19A:
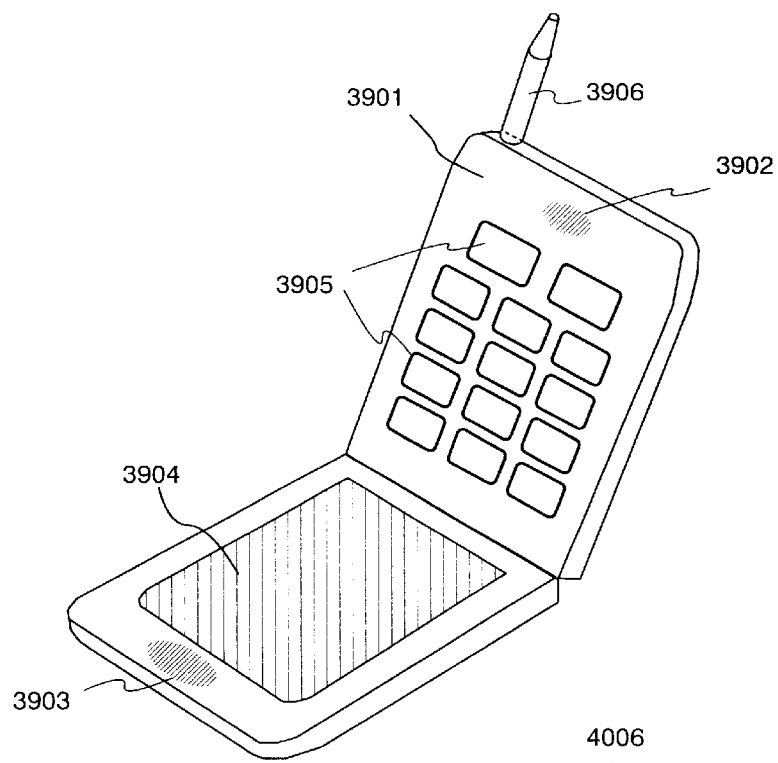
FIGS. 19A to 19C are examples of semiconductor devices.

FIG. 19A shows a portable telephone including a main body 3901, a sound output portion 3902, a sound input portion 3903, a display portion 3904, an operation switch 3905, an antenna 3906 and the like. The present invention can be applied to display portion 3904.

Figure 19B:
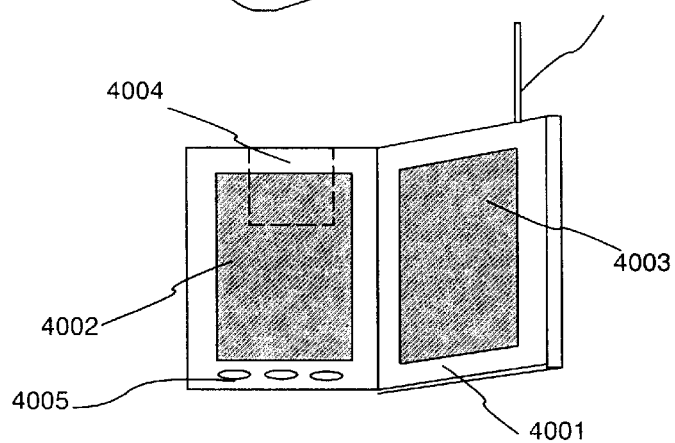

FIG. 19B shows a portable book (electronic book) including a main body 4001, display portions 4002, 4003, a record medium 4004, an operation switch 4005, an antenna 4006 and the like. The present invention can be applied to display portions 4002 and 4003.

Figure 19C:
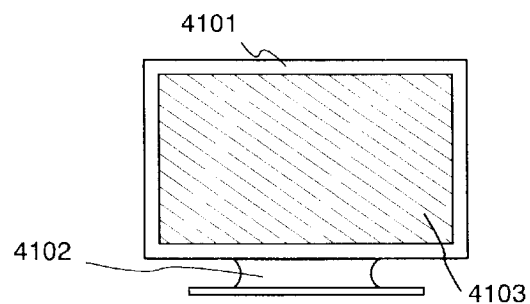

FIG. 19C shows a display including a main body 4101, a support base 4102, a display portion 4103 and the like. The present invention can be applied to display portion 4103. The display according to the invention is advantageous particularly in the case of large screen formation and is advantageous in the display having a diagonal length of 10 inch or more (particularly, 30 inch or more).

As has been described, the range of applying the present invention is extremely wide and is applicable to electronic apparatus of all the fields. The electronic apparatus of the present invention can be implemented by a combination of Embodiments 1 thorough 6 or 1 through 7, a combination of Embodiments 1 through 5 and 8 or 9, a combination of Embodiments 1 through 5 and 10 or 11.

The structures of the present invention are adopted, whereby the basic significance can be obtained as follows.

(a) The high coherence of the laser light can be reduced.
(b) It is possible to form the laser light having energy corresponding to that of the laser light emitted from the large-output laser.
(c) The deterioration of the non-linear optical element can be reduced.
(d) When the laser light is made incident slant on the substrate, there is no influence of the return light, and this is effective in the case of using the solid laser. Further, the laser light is made incident slant on the substrate, whereby the coherence can be reduced with respect to the laser light having a long coherent length.
(e) The above-described advantages are satisfied. Besides, the laser light irradiation can be performed with efficiency in accordance with the laser irradiation method and the laser irradiation apparatus for conducting the method. Thus, the throughput can be improved. Further, in the semiconductor device typified by the active matrix liquid crystal display device, the improvement of the operational characteristics and reliability of the semiconductor device can be realized. Furthermore, the deterioration of the non-linear optical element can be reduced as described in the above (c), and thus, the reduction of the manufacturing cost of the semiconductor device can be realized.

What is claimed is:

1. A laser irradiation method comprising:
   synthesizing a plurality of laser lights into a laser light by using a waveguide;
   condensing the laser light at an irradiation surface; and
   irradiating an object to be irradiated with the laser light while relatively moving the laser light.

2. A laser irradiation method according to claim 1, wherein at least one of a continuous oscillation and a pulse oscillation solid laser is used as the laser.

3. A laser irradiation method according to claim 1, wherein at least one selected from the group consisting of a YAG laser, a $YVO_4$ laser, a YLF laser, a $YAlO_3$ laser, a glass laser, a ruby laser, an alexandrite laser, a Ti:sapphire laser, an excimer laser, an Ar laser, and a Kr laser is used as the laser.

4. A laser irradiation method according to claim 1, wherein at least one laser light among the plurality of laser lights is converted into a harmonic by a non-linear optical element.

5. A laser irradiation method according to claim 1, wherein the plurality of laser lights are synthesized into a laser light by further using a thin film polarizer.

6. A laser irradiation method according to claim 1, wherein at least one of a galvanometer, a polygon mirror, and an fθ lens is used to move the laser light.

7. A laser irradiation method according to claim 1, wherein the irradiation surface is provided slant to the laser light, and when the laser light has a beam width W and a substrate has a thickness d, an incident angle φ to the irradiation surface of the laser light satisfies the equation: $\phi \geq \arcsin(W/2d)$.

8. A laser irradiation method according to claim 1, wherein the laser light is moved by a deflection.

9. A laser irradiation method according to claim 1, further comprising a step of moving the object while irradiating the laser light.

10. A method of manufacturing a semiconductor device, comprising:
    synthesizing a plurality of laser lights into a laser light by using a waveguide;
    condensing the laser light at an irradiation surface; and
    irradiating the laser light to a semiconductor film while relatively moving the laser light.

11. A method of manufacturing a semiconductor device, comprising:
synthesizing a plurality of laser lights into a laser light by using a waveguide;
condensing the laser light at an irradiation surface; and
irradiating the laser light to a semiconductor film while moving the laser light by a deflection.

12. A method of manufacturing a semiconductor device, comprising:
synthesizing a plurality of laser lights into a laser light by using a waveguide;
condensing the laser light at an irradiation surface; and
irradiating the laser light to a semiconductor film while moving the laser light in a first direction and moving the semiconductor film in a second direction.

13. A method of manufacturing a semiconductor device, comprising:
emitting a plurality of laser lights from a plurality of lasers, each of the plurality of laser lights passing through a non-linear optical element;
synthesizing the plurality of laser lights into a laser light by using a waveguide;
condensing the laser light at an irradiation surface; and
irradiating the laser light to a semiconductor film while relatively moving the laser light.

14. A method of manufacturing a semiconductor device, comprising:
introducing an impurity element to a semiconductor film;
synthesizing a plurality of laser lights into a laser light by using a waveguide;
condensing the laser light at an irradiation surface; and
irradiating the laser light to the semiconductor film while relatively moving the laser light, thereby performing an activation of the impurity element or a recovery of a crystallinity of the semiconductor film.

15. A method of manufacturing a semiconductor device, comprising:
introducing an impurity element to a semiconductor film;
synthesizing a plurality of laser lights into a laser light by using a waveguide;
condensing the laser light at an irradiation surface; and
irradiating the laser light to the semiconductor film while moving the laser light by a deflection, thereby performing an activation of the impurity element or a recovery of a crystallinity of the semiconductor film.

16. A method of manufacturing a semiconductor device, comprising:
introducing an impurity element to a semiconductor film;
synthesizing a plurality of laser lights into a laser light by using a waveguide;
condensing the laser light at an irradiation surface; and
irradiating the laser light to the semiconductor film while moving the laser light in a first direction and moving the semiconductor film in a second direction, thereby performing an activation of the impurity element or a recovery of a crystallinity of the semiconductor film.

17. A method of manufacturing a semiconductor device, comprising:
introducing an impurity element to a semiconductor film;
emitting a plurality of laser lights from a plurality of lasers, each of the plurality of laser lights passing through a non-linear optical element;
synthesizing the plurality of laser lights into a laser light by using a waveguide;
condensing the laser light at an irradiation surface; and
irradiating the laser light to the semiconductor film while relatively moving the laser light, thereby performing an activation of the impurity element or a recovery of a crystallinity of the semiconductor film.

18. A method of manufacturing a semiconductor device according to any one of claims 10 to 17, wherein at least one of a continuous oscillation and a pulse oscillation solid laser is used as the laser light.

19. A method of manufacturing a semiconductor device according to any one of claims 10 to 17, wherein at least one selected from the group consisting of a YAG laser, a $YVO_4$ laser, a YLF laser, a $YAlO_3$ laser, a glass laser, a ruby laser, an alexandrite laser, a Ti:sapphire laser, an excimer laser, an Ar laser, and a Kr laser is used as the laser light.

20. A method of manufacturing a semiconductor device according to any one of claims 10 to 17, wherein at least one laser light among the plurality of laser lights is converted into a harmonic by a non-linear optical element.

21. A method of manufacturing a semiconductor device according to any one of claims 10 to 17, wherein a thin film polarizer is further used to synthesize the plurality of laser lights into a laser light.

22. A method of manufacturing a semiconductor device according to any one of claims 10 to 17, wherein at least one of a galvanometer, a polygon mirror, and an fθ lens is used to move the laser light.

23. A method of manufacturing a semiconductor device according to any one of claims 10 to 17, wherein the irradiation surface is provided slant to the laser light, and when the laser light has a beam width W and a substrate has a thickness d, an incident angle φ to the irradiation surface of the laser light satisfies the equation: $\phi \geq \arcsin(W/2d)$.

24. A method of manufacturing a semiconductor device according to any one of claims 10 to 17 therein the semiconductor device is at least one selected from the group consisting of a personal computer, a video camera, a mobile computer, a goggle type display, a player using a recording medium, a digital camera, a projector, a portable telephone, and a portable electronic book.

25. A laser irradiation method comprising:
synthesizing a plurality of laser lights into a laser light by using a waveguide;
condensing the laser light in the vicinity of the irradiation surface; and
irradiating an object to be irradiated with the laser light while relatively moving the laser light.

26. A laser irradiation method according to claim 25, wherein at least one of a continuous oscillation and a pulse oscillation solid laser is used as the laser.

27. A laser irradiation method according to claim 25, wherein at least one selected from the group consisting of a YAG laser, a $YVO_4$ laser, a YLF laser, a $YAlO_3$ laser, a glass laser, a ruby laser, an alexandrite laser, a Ti:sapphire laser, an excimer laser, an Ar laser, and a Kr laser is used as the laser.

28. A laser irradiation method according to claim 25, wherein at least one laser light among the plurality of laser lights is converted into a harmonic by a non-linear optical element.

29. A laser irradiation method according to claim 25, wherein the plurality of laser lights are synthesized into a laser light by further using a thin film polarizer.

30. A laser irradiation method according to claim 25, wherein at least one of a galvanometer, a polygon mirror, and an fθ lens is used to move the laser light.

31. A laser irradiation method according to claim 25, wherein the irradiation surface is provided slant to the laser light, and when the laser light has a beam width W and a substrate has a thickness d, an incident angle φ to the irradiation surface of the laser light satisfies the equation: φ≧arcsin (W/2d).

32. A laser irradiation method according to claim 25, wherein the laser light is moved by a deflection.

33. A laser irradiation method according to claim 25, further comprising a step of moving the object while irradiating the laser light.

34. A method of manufacturing a semiconductor device, comprising:
synthesizing a plurality of laser lights into a laser light by using a waveguide;
condensing the laser light in the vicinity of the irradiation surface; and
irradiating the laser light to a semiconductor film while relatively moving the laser light.

35. A method of manufacturing a semiconductor device, comprising:
synthesizing a plurality of laser lights into a laser light by using a waveguide;
condensing the laser light in the vicinity of the irradiation surface; and
irradiating the laser light to a semiconductor film while moving the laser light by a deflection.

36. A method of manufacturing a semiconductor device, comprising:
synthesizing a plurality of laser lights into a laser light by using a waveguide;
condensing the laser light in the vicinity of the irradiation surface; and
irradiating the laser light to a semiconductor film while moving the laser light in a first direction and moving the semiconductor film in a second direction.

37. A method of manufacturing a semiconductor device, comprising:
emitting a plurality of laser lights from a plurality of lasers, each of the plurality of laser lights passing through a non-linear optical element;
synthesizing the plurality of laser lights into a laser light by using a waveguide;
condensing the laser light in the vicinity of the irradiation surface; and
irradiating the laser light to a semiconductor film while relatively moving the laser light.

38. A method of manufacturing a semiconductor device, comprising:
introducing an impurity element to a semiconductor film;
synthesizing a plurality of laser lights into a laser light by using a waveguide;
condensing the laser light in the vicinity of the irradiation surface; and
irradiating the laser light to the semiconductor film while relatively moving the laser light, thereby performing an activation of the impurity element or a recovery of a crystallinity of the semiconductor film.

39. A method of manufacturing a semiconductor device, comprising:
introducing an impurity element to a semiconductor film;
synthesizing a plurality of laser lights into a laser light by using a waveguide;
condensing the laser light in the vicinity of the irradiation surface; and
irradiating the laser light to the semiconductor film while moving the laser light by a deflection, thereby performing an activation of the impurity element or a recovery of a crystallinity of the semiconductor film.

40. A method of manufacturing a semiconductor device, comprising:
introducing an impurity element to a semiconductor film;
synthesizing a plurality of laser lights into a laser light by using a waveguide;
condensing the laser light in the vicinity of the irradiation surface; and
irradiating the laser light to the semiconductor film while moving the laser light in a first direction and moving the semiconductor film in a second direction, thereby performing an activation of the impurity element or a recovery of a crystallinity of the semiconductor film.

41. A method of manufacturing a semiconductor device, comprising:
introducing an impurity element to a semiconductor film;
emitting a plurality of laser lights from a plurality of lasers, each of the plurality of laser lights passing through a non-linear optical element;
synthesizing the plurality of laser lights into a laser light by using a waveguide;
condensing the laser light in the vicinity of the irradiation surface; and
irradiating the laser light to the semiconductor film while relatively moving the laser light, thereby performing an activation of the impurity element or a recovery of a crystallinity of the semiconductor film.

42. A method of manufacturing a semiconductor device according to any one of claims 34 to 41, wherein at least one of a continuous oscillation and a pulse oscillation solid laser is used as the laser light.

43. A method of manufacturing a semiconductor device according to any one of claims 34 to 41, wherein at least one selected from the group consisting of a YAG laser, a $YVO_4$ laser, a YLF laser, a $YAlO_3$ laser, a glass laser, a ruby laser, an alexandrite laser, a Ti:sapphire laser, an excimer laser, an Ar laser, and a Kr laser is used as the laser light.

44. A method of manufacturing a semiconductor device according to any one of claims 34 to 41, wherein at least one laser light among the plurality of laser lights is converted into a harmonic by a non-linear optical element.

45. A method of manufacturing a semiconductor device according to any one of claims 34 to 41, wherein a thin film polarizer is further used to synthesize the plurality of laser lights into a laser light.

46. A method of manufacturing a semiconductor device according to any one of claims 34 to 41, wherein at least one of a galvanometer, a polygon mirror, and an fθ lens is used to move the laser light.

47. A method of manufacturing a semiconductor device according to any one of claims 34 to 41, wherein the irradiation surface is provided slant to the laser light, and when the laser light has a beam width W and a substrate has a thickness d, an incident angle φ to the irradiation surface of the laser light satisfies the equation: φ≧arcsin (W/2d).

48. A method of manufacturing a semiconductor device according to any one of claims 34 to 41, wherein the semiconductor device is at least one selected from the group consisting of a personal computer, a video camera, a mobile computer, a goggle type display, a player using a recording medium, a digital camera, a projector, a portable telephone, and a portable electronic book.

* * * * *